US009485856B2

(12) United States Patent
Ichiki

(10) Patent No.: US 9,485,856 B2
(45) Date of Patent: *Nov. 1, 2016

(54) TRANSPARENT ELECTRODE SHEET, METHOD FOR MANUFACTURING TRANSPARENT ELECTRODE SHEET, AND CAPACITIVE TOUCH PANEL USING SUCH TRANSPARENT ELECTRODE SHEET

(71) Applicant: FUJIFILM Corporation, Minato-ku, Tokyo (JP)

(72) Inventor: Akira Ichiki, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 14/291,201

(22) Filed: May 30, 2014

(65) Prior Publication Data
US 2014/0267954 A1 Sep. 18, 2014

Related U.S. Application Data

(63) Continuation of application No. 13/944,105, filed on Jul. 17, 2013, now Pat. No. 9,271,394, which is a continuation of application No. PCT/JP2012/050506, filed on Jan. 12, 2012.

(30) Foreign Application Priority Data

Jan. 18, 2011 (JP) .................................. 2011-008327
Apr. 13, 2011 (JP) .................................. 2011-089400

(51) Int. Cl.
*G06F 3/041* (2006.01)
*H05K 1/02* (2006.01)
(Continued)

(52) U.S. Cl.
CPC .............. *H05K 1/0274* (2013.01); *G06F 3/044* (2013.01); *H05K 1/03* (2013.01); *H05K 3/106* (2013.01);
(Continued)

(58) Field of Classification Search
CPC ...... H05K 1/0274; H05K 1/03; H05K 3/106; H05K 2201/0108; H05K 2201/0317; H05K 2201/032; G06F 2203/04103; G06F 3/044; G06F 2203/04112
USPC .............. 174/250, 253, 255–257; 178/18.01
See application file for complete search history.

(56) References Cited

U.S. PATENT DOCUMENTS

| 5,440,080 A | 8/1995 | Nagaoka et al. |
| 2009/0246486 A1 | 10/2009 | Sasaki |

(Continued)

FOREIGN PATENT DOCUMENTS

| CN | 101120304 A | 2/2008 |
| CN | 101728010 A | 6/2010 |

(Continued)

OTHER PUBLICATIONS

Office Action dated May 5, 2015, issued by the State Intellectual Property Office of the People's Republic of China in counterpart Chinese Application No. 201410219154.

(Continued)

*Primary Examiner* — Tremesha S Willis
(74) *Attorney, Agent, or Firm* — Sughrue Mion, PLLC

(57) ABSTRACT

A transparent electrode sheet includes a transparent support having thereon a patterned electrode, wherein the electrode is made from a metal thin wire, a thickness of the metal thin wire is 0.1 μm or more, and an absolute value of a difference between a reflection chromaticity $b_1^*$ of a surface of the electrode at far side from the transparent support and a reflection chromaticity $b_2^*$ of a surface of the electrode at near side to the transparent support is not more than 2.

31 Claims, 9 Drawing Sheets

(51) Int. Cl.
*G06F 3/044* (2006.01)
*H05K 1/03* (2006.01)
*H05K 3/10* (2006.01)

(52) U.S. Cl.
CPC ............... *G06F 2203/04103* (2013.01); *G06F 2203/04112* (2013.01); *H05K 2201/0108* (2013.01); *H05K 2201/032* (2013.01); *H05K 2201/0317* (2013.01)

(56) References Cited

U.S. PATENT DOCUMENTS

2010/0294536 A1  11/2010  Usami
2011/0102370 A1   5/2011  Kono et al.

FOREIGN PATENT DOCUMENTS

| JP | 6-309090 A | 11/1994 |
| JP | 2005251690 A | 9/2005 |
| JP | 2007116137 A | 5/2007 |
| JP | 2007-188655 A | 7/2007 |
| JP | 2007-276322 A | 10/2007 |
| JP | 2010-39537 A | 2/2010 |
| JP | 2010-61425 A | 3/2010 |
| JP | 2010108878 A | 5/2010 |
| JP | 2010262529 A | 11/2010 |
| WO | 2010/014683 A2 | 2/2010 |
| WO | 2010099132 A2 | 9/2010 |

OTHER PUBLICATIONS

Office Action issued on Nov. 17, 2015, by the Japanese Patent Office in counterpart Japanese Application No. 2014-074014.
Office Action issued on Nov. 10, 2015 by the Taiwanese Patent Office in counterpart Taiwanese Application No. 103118511.
Office Action dated Sep. 6, 2015, issued by the State Intellectual Property Office of the People's Republic of China in counterpart Chinese Application No. 201280005721.0.
International Search Report dated Feb. 14, 2012 issued in International Application No. PCT/JP2012/050506 (PCT/ISA/210).
Written Opinion dated Feb. 14, 2012 issued in International Application No. PCT/JP2012/050506 (PCT/ISA/237).
Office Action issued on May 3, 2016, by the State Intellectual Property Office of P.R. China in counterpart Chinese Application No. 201280005721.0.

TRANSPARENT ELECTRODE SHEET, METHOD FOR MANUFACTURING TRANSPARENT ELECTRODE SHEET, AND CAPACITIVE TOUCH PANEL USING SUCH TRANSPARENT ELECTRODE SHEET

CROSS REFERENCE TO RELATED APPLICATION

This is a continuation of U.S. application Ser. No. 13/944,105 filed on Jul. 17, 2013, which is a continuation of International Application No. PCT/JP2012/050506 filed on Jan. 12, 2012, and claims priority from Japanese Patent Application No. 2011-008327 filed on Jan. 18, 2011 and Japanese Patent Application No. 2011-089400 filed on Apr. 13, 2011, the entire disclosures of which are incorporated herein by reference.

TECHNICAL FIELD

The present invention relates to a transparent electrode sheet having conductive thin wires formed therein, a method for manufacturing such a transparent electrode sheet, and a capacitive touch panel using such a transparent electrode sheet.

BACKGROUND ART

In recent years, in the field of touch panels, projected capacitive touch panels have been widely used for PDA, mobile phones, and the like, and an attempt to increase the size of a touch panel of this type has started. In increasing the size of a panel, a low resistance of a transparent electrode is essential, and as technologies for achieving this low resistance, a method for forming a sensing section of capacitance using reticulated conductive thin wires is described in, for example, Patent Documents 1 and 2. The forming method of reticulated conductive thin wires described in these documents is concerned with a printing system of a conductive ink or thinning by means of photolithography of ITO or a metal thin film. However, these methods involve such problems that in the former printing system, it is difficult to stably form thin wires with a wire width of not more than 20 μm, whereas the latter involves such a problem that the costs are high because the photolithography step is constituted of plural steps.

On the other hand, a method in which low-resistance conductive thin wires are formed from a silver image obtained by development of a silver halide photographic photosensitive material is investigated in the field of an electromagnetic wave shielding film or a printed wiring. This development system is stable in terms of manufacturing steps because various patterns can be formed by means of exposure through a mask and a subsequent development treatment. As for the development system, for example, Patent Document 3 can be exemplified, and working examples in which reticulated patterns having a thin wire width of 20 μm and a lattice spacing of 250 μm have a surface resistivity of from 50 to 100Ω/ are described therein.

PRIOR ART DOCUMENTS

Patent Documents

Patent Document 1: JP-A-2010-039537
Patent Document 2: WO2010/014683
Patent Document 3: JP-A-2007-188655

SUMMARY OF THE INVENTION

Problems to be Solved by the Invention

In recent years, it is attempted to apply the foregoing development system to the formation of an electrode of a capacitive touch panel. However, it has been noted that there is involved such a problem that a phenomenon in which the color of conductive thin wires made from developed silver as formed delicately changes depending upon various conditions occurs, thereby resulting in poor visibility of the touch panel. In addition, a phenomenon in which the color tint of the formed conductive thin wires changes depending upon a forming condition may be sometimes observed even in a system of printing a conductive ink such as a silver paste, etc., or a system adopting vapor deposition or sputtering, in particular in the case of forming an electrode having a thick film thickness. It may be presumed that these phenomena occur due to the fact that in the case of forming a relatively thick electrode film, the minute shape of the film differs between a film at the beginning of formation process and a film after the film thickness has become thick. However, such is not elucidated yet.

In view of the foregoing problem, the present invention has been made, and an object thereof is to provide a transparent electrode sheet in which a color tone of the electrode surface is controlled. Furthermore, an object of the present invention is to provide a transparent electrode sheet in which a color tone of the electrode made from developed silver is controlled. In addition, an object of the present invention is to provide a method for manufacturing a transparent electrode sheet in which a color tone of such an electrode is controlled. Moreover, an object of the present invention is to provide a transparent electrode capable of not only controlling a color tone of the electrode but being used for a low-resistant, large-screen touch panel. In addition, another object of the present invention is to provide other applications than the foregoing touch panel, using the foregoing transparent electrode sheet having an improved color tone.

Means for Solving the Problems

The present inventor eagerly examined any reason of occurrence of unevenness of the color tint and as a result, has led to the present invention from the following facts.

In a representative constitution of an electrode of a projected capacitive touch panel, an upper electrode sheet and a lower electrode sheet are stacked via an insulator from the side of a viewer of the touch panel. One of embodiments according to the present invention is hereunder described by reference to an example of the electrode formation by a development system. In the development system, in each of two upper and lower electrode sheets, a silver halide photosensitive material is coated on a transparent support, and a patterned developed silver electrode is formed on the transparent support by means of exposure through a mask exhibiting an electrode pattern and development. Embodiments on the occasion of stacking these two electrode sheets to constitute a touch panel are shown in FIGS. 2 to 4 and FIG. 12. In the embodiment of FIG. 2, a touch panel user views a front side surface b1 of the developed silver thin wire of the upper and lower electrode sheets (thin wire surface of the far side from the transparent support); and in the embodiment of FIG. 3, a touch panel user views a rear side surface b2 of the developed silver thin wire of the upper and lower electrode sheets (thin wire surface of the near side to the transparent support). On the other hand, in the embodiment of FIG. 4, a touch panel user views a rear side surface b2 of the developed silver thin wire of the upper electrode sheet (surface of the near side to the transparent support) and a front side surface b1 of the developed silver thin wire of the lower electrode sheet (thin wire surface of the far side from the transparent support) at the same time. Furthermore, in the embodiment of FIG. 12, a touch panel user views a front side surface b1 of the developed silver thin wire of the upper electrode sheet (surface of the far side from the transparent support) and a rear side surface b2 of the developed silver thin wire of the lower electrode sheet (thin wire surface of the near side to the transparent support) at the same time. In these four types of embodiments, the present inventor has found that in only the embodiments of FIGS. 4 and 12, color unevenness between the electrodes occurs; that in the embodiments of FIGS. 2 and 3, color unevenness between the electrodes is not observed; that though FIGS. 2 and 3 are uniform in color tone as the respective electrodes, FIGS. 2 and 3 are different in color tint of electrode; and that in the embodiments of FIGS. 4 and 12, in the case where a density of silver of the electrode is large, color unevenness occurs easily, whereas in the case of a density of silver of the same degree in the conventional image formation, color unevenness occurs hardly, thereby leading to accomplishment of the present invention.

[1] A transparent electrode sheet including a transparent support having thereon patterned electrodes, characterized in that an absolute value of a difference between a reflection chromaticity $b_1^*$ of the electrode surface of the far side from the transparent support and a reflection chromaticity $b_2^*$ of the electrode surface of the near side to the transparent support is not more than $2(|\Delta b^*|=|b_1^*-b_2^*|\leq 2)$.

[2] The transparent electrode sheet as set forth in Item 1, characterized in that the absolute value of a difference between the reflection chromaticity $b_1^*$ of the electrode and the reflection chromaticity $b_2^*$ of the electrode is not more than 1.5, and more preferably not more than 1.0.

[3] The transparent electrode sheet as set forth in Item 1 or 2, characterized in that the reflection chromaticity $b_1^*$ of the electrode surface measured from the far side from the transparent support satisfies a relation of $(b_1^*\leq 0)$.

[4] The transparent electrode sheet as set forth in any one of Items 1 to 3, characterized in that the electrode is a layer formed by exposing and developing at least one photosensitive layer containing a silver halide emulsion formed on the transparent support, and a volume ratio of silver and a binder contained in the photosensitive layer (silver/binder ratio) is 1.0 or more.

[5] The transparent electrode sheet as set forth in Item 4, characterized by including a layer having a volume ratio of silver and a binder contained in the photosensitive layer (silver/binder ratio) of 1.5 or more.

[6] The transparent electrode sheet as set forth in any one of Items 1 to 5, characterized in that the photosensitive layer containing a silver halide emulsion contains at least one mercapto compound, and the content of the mercapto compound in the photosensitive layer is higher in the photosensitive layer of the surface side near to the transparent support.

[7] The transparent electrode sheet as set forth in Item 6, characterized in that the mercapto compound is a mercapto compound comprising, as a skeleton, a 5-membered ring azole having an N—H structure or a 6-membered ring azine having an N—H structure, the N—H structure means a nitrogen-hydrogen bond contained in an azole or an azine, and the hydrogen is dissociable.

[8] The transparent electrode sheet as set forth in Item 6, characterized in that the mercapto compound has, as a substituent, an $SO^3M$ group at any one of from the 4-position to the 7-position of 2-mercaptobenzoimidazole and further has, as a substituent, at least one group selected from a hydrogen atom, a hydroxyl group, a lower alkyl group, a lower alkoxy group, a carboxyl group, a halogen group, and a sulfo group, and M is an alkali metal atom or an ammonium group.

[9] The transparent electrode sheet as set forth in any one of Items 1 to 8, characterized in that the amount of the mercapto compound contained in the at least one photosensitive layer is 0.1 mg or more and not more than 15 mg per gram of silver in the silver halide emulsion contained in the same layer as that in the mercapto compound.

[10] The transparent electrode sheet as set forth in any one of Items 1 to 9, characterized in that the silver halide emulsion is a silver chlorobromide emulsion, and a solubility of the silver halide emulsion of the photosensitive layer of the surface side near to the transparent support in a developing solution is lower than a solubility of the silver halide emulsion of the photosensitive layer of the surface side far from the transparent support in a developing solution.

[11] The transparent electrode sheet as set forth in any one of Items 1 to 10, characterized in that an average silver bromide content in the whole of the silver chlorobromide emulsion-containing photosensitive layer is 10% or more and not more than 50%.

[12] The transparent electrode sheet as set forth in any one of Items 1 to 11, characterized in that a silver bromide content of the silver chlorobromide emulsion of the photosensitive layer of the transparent support side is higher than a silver bromide content of the photosensitive layer of the surface side far from the transparent support.

[13] The transparent electrode sheet as set forth in Item 12, characterized in that the silver bromide content contained in the photosensitive layer of the surface side far from the transparent support is higher by 10% or more than the silver bromide content of the photosensitive layer of the surface side near to the transparent support.

[14] The transparent electrode sheet as set forth in any one of Items 1 to 13, characterized in that a volume ratio of silver and a binder contained in the photosensitive layer of the near side to the transparent support is less than 1.0.

[15] The transparent electrode sheet as set forth in any one of Items 1 to 13, characterized in that a volume ratio of silver and a binder contained in each of the photosensitive layer of the near side to the transparent support and the photosensitive layer of the far side from the transparent support is less than 1.0.

[16] The transparent electrode sheet as set forth in any one of Items 1 to 15, characterized in that a wire width of conductive thin wires constituting the patterned electrode is not more than 10 μm, and preferably 1 μm or more and not more than 10 μm.

[17] The transparent electrode sheet as set forth in any one of Items 1 to 16, characterized in that a wire width of the conductive thin wires is 2 μm or more and not more than 6 μm.

[18] The transparent electrode sheet as set forth in any one of Items 1 to 17, characterized in that a thickness of the conductive thin wires is 0.1 μm or more and not more than 1.5 μm.

[19] The transparent electrode sheet as set forth in any one of Items 1 to 17, characterized in that a thickness of the conductive thin wires is 0.2 μm or more and not more than 0.8 μm.

[20] The transparent electrode sheet as set forth in any one of Items 1 to 19, which is a transparent electrode sheet including a transparent support having thereon patterned electrodes, characterized in that a reflection chromaticity $b_1^*$ of the electrode surface of the far side from the transparent support and a reflection chromaticity $b_2^*$ of the electrode surface of the near side to the transparent support satisfy relations of $(-2.0 < b_1^* \leq 0)$ and $(-1.0 < b_2^* \leq 1.0)$.

[21] The transparent electrode sheet as set forth in any one of Items 1 to 19, which is a transparent electrode sheet including a transparent support having on the both surfaces thereof patterned electrodes, characterized in that an absolute value of a difference between a reflection chromaticity $b_1^*$ of the electrode surface positioned far from the support of one surface and a reflection chromaticity $b_2^*$ of the electrode surface positioned near to the support of the other surface is not more than $2(|\Delta b^*|=|b_1^*-b_2^*| \leq 2)$.

[22] The transparent electrode sheet as set forth in Item 21, characterized in that $|\Delta b^*|$ is not more than 1.

[23] The transparent electrode sheet as set forth in Item 21 or 22, characterized in that $b_1^*$ satisfies a relation of $(-2.0 < b_1^* \leq 0)$, and $b_2^*$ satisfies a relation of $(-1.0 < b_2^* \leq 1.0)$.

[24] The transparent electrode sheet as set forth in Item 21 or 22, characterized in that $b_1^*$ satisfies a relation of $(-1.0 < b_1^* \leq -0.5)$, and $b_2^*$ satisfies a relation of $(-0.5 < b_2^* \leq 0.2)$.

[25] A capacitive touch panel obtained by using two sheets of the transparent electrode sheet as set forth in any one of Items 1 to 19 and stacking the two sheets via an insulator such that the electrode sides thereof face and oppose each other, characterized in that the directions of conduction of conductive thin wires of the electrodes of the two electrode sheets are substantially orthogonal to each other.

[26] A touch panel obtained by using two sheets of the transparent electrode sheet as set forth in any one of Items 1 to 19 and stacking the two sheets such that the transparent support sides of the two electrode sheets face on the side of a viewer, or the electrode sides of the two electrode sheets face on the side of a viewer, characterized in that the directions of conduction of conductive thin wires of the electrodes of the two electrode sheets are substantially orthogonal to each other.

The transparent electrode sheet having an improved color tone according to the present invention can be applied to not only electrode materials to be used for the above-described capacitive touch panel but all materials so long as they are related to visibility of a person and conductivity because the color tone of the surface of a conductive material is improved. Applicable examples thereof are described below. In transparent conductive sheets to be used for resistive film type touch panels, electromagnetic wave shielding sheets for shielding electromagnetic waves from the inside of an image display device, and the like, the technology of the present invention can be utilized merely by changing a pattern of conductive thin wires formed by patterning of the electrode of the present invention. In addition, by adjusting a resistivity value of the electrode of the present invention, heater sheets and antistatic sheets can be fabricated, too.

Effects of the Invention

The transparent electrode sheet according to the present invention can be applied to all of the embodiments shown in FIGS. 2 to 4 and FIG. 12, is able to provide a uniform screen with a small difference in color tint, and is large in terms of a degree of freedom for designing a capacitive touch panel. Since the electrode sheet according to the present invention is of a low resistance, it is able to provide a touch panel which even when formed so as to have a large area, is excellent in terms of responsibility, is excellent in terms of, in addition to a color tint, visibility such that when seen as a screen, neither extraneous matter nor moire or the like is felt, and is able to achieve multi-touch. Furthermore, since the electrode can be formed by a stable step that is a development treatment, a touch panel which is excellent in terms of stability on processing and manufacturing and stable in terms of quality can be obtained. In addition, when the transparent electrode sheet according to the present invention is applied, a transparent conductive sheet to be used for resistive film type touch panels having an excellent color tone, an electromagnetic wave shielding sheet, a heater sheet, and an antistatic sheet can be obtained.

MODES FOR CARRYING OUT THE INVENTION

Figure 1:
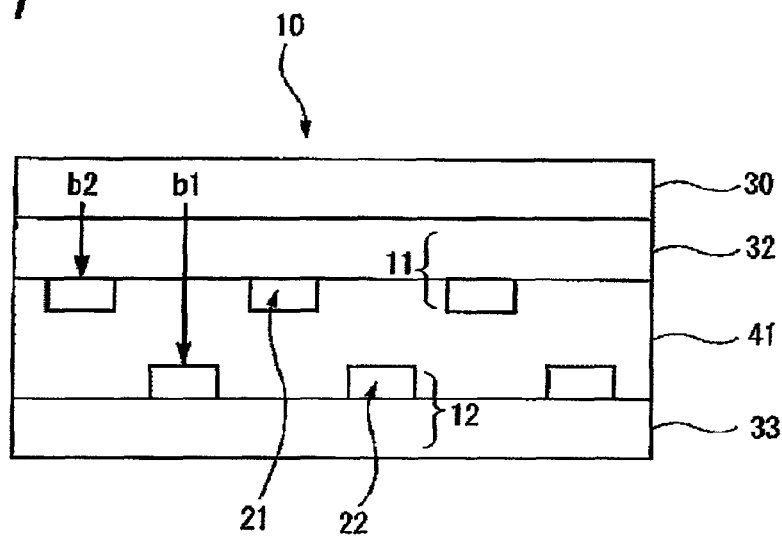
FIG. 1 is a schematic cross-sectional view of a touch panel according to the present invention.
Figure 2:
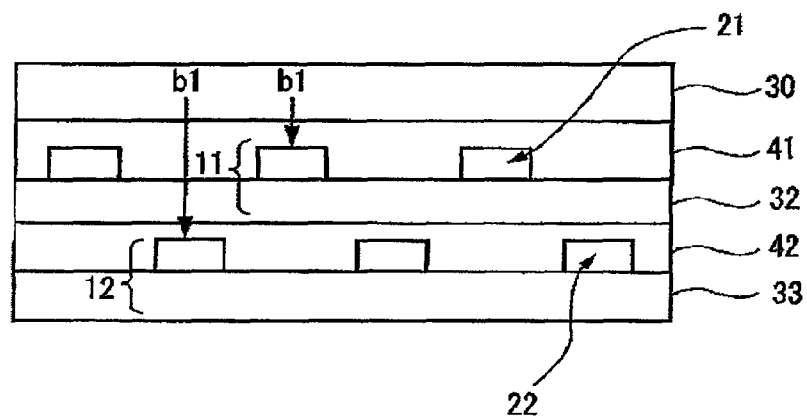
FIG. 2 is a schematic view of an embodiment of a stacking system of an upper electrode sheet and a lower electrode sheet.

Embodiments of an electrode sheet, a method for manufacturing an electrode sheet, and a touch panel according to the present invention are hereunder described by reference to FIGS. 1 to 11. Incidentally, in this specification, a numerical range expressed by the terms "a number to another number" means a range falling between the former number indicating a lower limit value of the range and the latter number indicating an upper limit value thereof.

The electrode sheet according to the present invention is a transparent electrode sheet including a transparent support having thereon patterned electrodes, wherein an absolute value of a difference between a reflection chromaticity $b_1^*$ of the electrode surface of the far side from the transparent support and a reflection chromaticity $b_2^*$ of the electrode surface of the near side to the transparent support is not more than 2 ($|\Delta b^*|=|b_1^*-b_2^*|\leq 2$).

As described at the beginning of the section of "MEANS FOR SOLVING THE PROBLEMS", an object of the present invention is to solve the problem that the color tint is different depending upon a direction from which the electrode sheet is watched. A phenomenon in which the color tint is different is again described. In FIG. 5, an arrow $b_1$ indicates the case of measuring a reflection chromaticity of the surface of the far side from a transparent support of an electrode 22 of an electrode sheet 11 (also referred to as "$b_1$ direction"); an arrow $b_2$ indicates the case of measuring a reflection chromaticity of the surface of the electrode 22 of the electrode sheet 11 from the near side to a transparent support 33 (also referred to as "$b_2$ direction"); and it is a problem that when the reflection chromaticity is measured from these two directions, a difference in reflection chromaticity of the electrode varies in terms of a degree at which it is viewed. The present invention is an invention made on the basis of the fact that when an absolute value of a difference between a reflection chromaticity $b_1^*$ from the $b_1$ direction and a reflection chromaticity $b_2^*$ from the $b_2$ direction is regulated to not more than 2, even by disposing the electrode sheets as in the disposition shown in FIG. 4 or FIG. 12, color unevenness is viewed hardly.

Incidentally, the reflection chromaticity $b^*$ is a characteristic value defined according to the L*a*b* color system. The L*a*b* color system is a method of color space established by Commission Internationale d'Eclairage (CIE) in 1976, and in the present invention, the L* value, a* value, and b* value are a value obtained through the measurement by a method stipulated in JIS-Z8729:1994. Though examples of the measurement method of JIS-Z8729 include a measurement method by reflection and a measurement method by transmission, in the present invention, values measured by reflection are adopted.

As widely known, with respect to the L* value, a* value, and b* value in the L*a*b* color system, the L* value represents a brightness, and the a* value and b* value represent a hue and a saturation. Specifically, when the a* value is a plus sign, then it stands for a red hue, whereas when the a* value is a minus sign, then it stands for a green hue. When the b* value is a plus sign, then it stands for a yellow hue, whereas when the b* value is a minus sign, then it stands for a blue hue. In addition, as for both of the a* value and the b* value, the larger the absolute value, the larger the saturation of the color and the more brilliant the color; whereas the smaller the absolute value, the smaller the saturation.

In the present invention, the a* value is small in a change in the observation directions ($b_1$ direction and $b_2$ direction). On the other hand, the b* value is larger in a change in the direction at which the electrode is observed than the a* value. Specifically, when the color tint changes from yellow to blue, color unevenness is viewed easily. Details of the measurement method are described in the section of "EXAMPLES".

Figure 4:
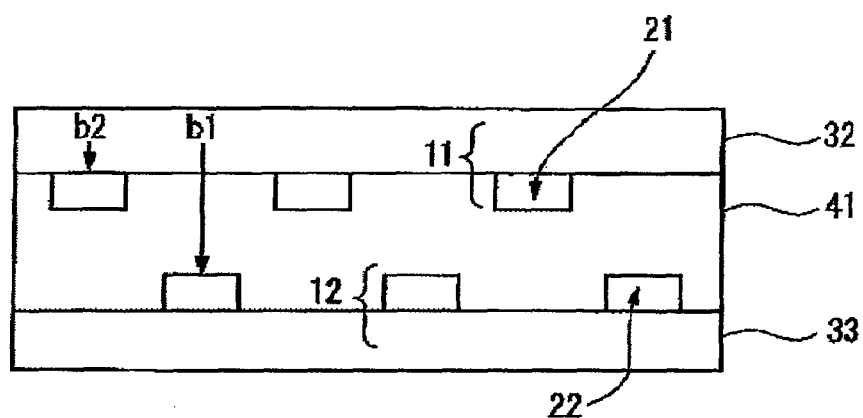
FIG. 4 is a schematic view of an embodiment of a stacking system of an upper electrode sheet and a lower electrode sheet.
Figure 5:
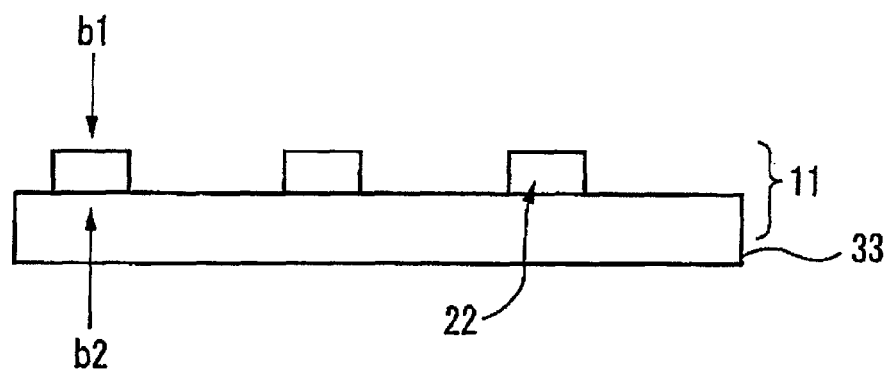
FIG. 5 is a schematic view explaining a direction at which a reflection chromaticity of an electrode sheet is measured.
Figure 6:
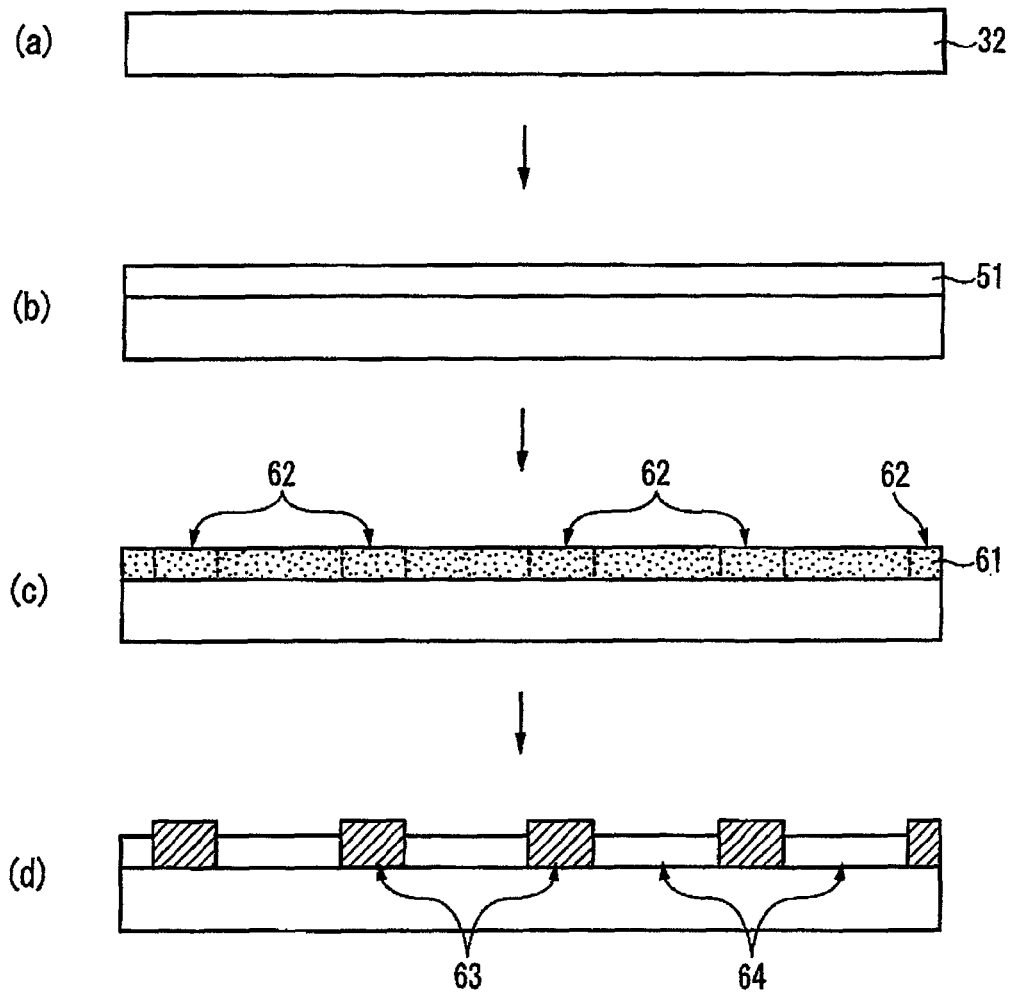
FIG. 6 is a conceptual view of an electrode forming process using a silver halide emulsion.

In the case where a touch panel user views a reflection chromaticity ($b_1^*$) of the electrode surface of the far side from the transparent support and a reflection chromaticity ($b_2^*$) of the electrode surface of the near side to the support at the same time as in a stacking example of electrode shown in FIG. 4, in order to improve the color unevenness, an absolute value of a difference ($\Delta b^*$) between the reflection chromaticity $b_1^*$ and the reflection chromaticity $b_2^*$ is required to satisfy the following relation.

$$|\Delta b^*|=|b_1^*-b_2^*|\leq 2$$

The relation is more preferably ($|\Delta b^*|\leq 1.5$), and especially preferably ($|\Delta b^*|\leq 1.0$).

In addition, it is preferable that when observed, the color tone is visually viewed easily as a black color. As for the measured values of $b_1^*$ and $b_2^*$, a value close to 0 is considered to be neutral. However, in the present invention, when the values of $b_1^*$ and $b_2^*$ are set up in the following way, a viewer easily views the color as a black color.

In the present invention, $b_1^*$ satisfies a relation of preferably ($-2.0<b_1^*\leq 0$), more preferably ($-1.5<b_1^*\leq -0.3$), and especially preferably ($-1.0<b_1^*\leq -0.5$).

$b_2^*$ satisfies a relation of preferably ($-1.0<b_2^*\leq 1.0$), more preferably ($-0.7<b_2^*\leq 0.5$), and especially preferably ($-0.5<b_2^*\leq 0.2$).

So far as the combination of $b_1^*$ and $b_2^*$ is concerned, a combination of ($-2.0<b_1^*\leq 0$) and ($-1.0<b_2^*\leq 1.0$) is preferable, a combination of ($-1.5<b_1^*\leq -0.3$) and ($-0.7<b_2^*\leq 0.5$) is more preferable, and a combination of ($-1.0<b_1^*\leq -0.5$) and ($-0.5<b_2^*\leq 0.2$) is especially preferable.

Figure 12:
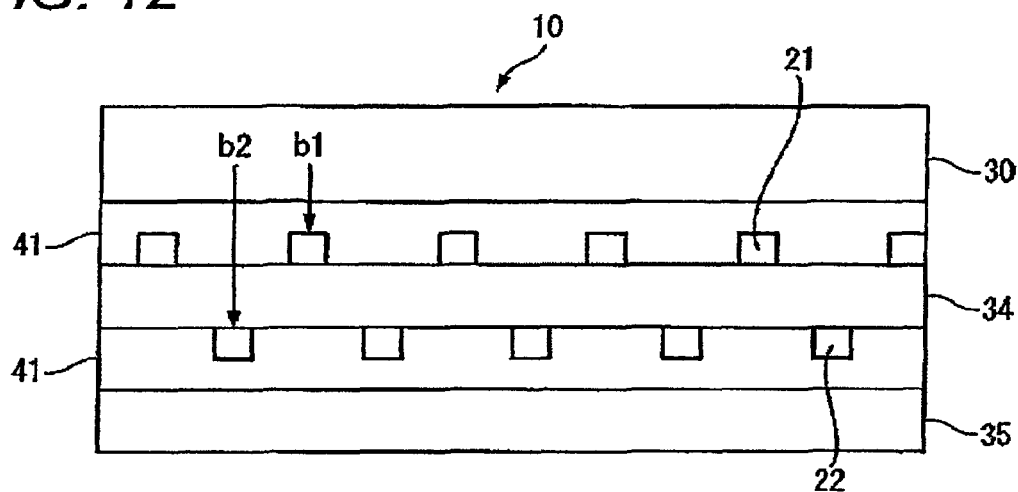
FIG. 12 is a schematic cross-sectional view of a touch panel using a double-sided electrode in which electrodes are formed on the both surfaces of a transparent support according to the present invention.

In addition, in the case where the constitution of the transparent electrode is one in which patterned electrodes are formed on the both surfaces of a single sheet of transparent support, as shown in FIG. 12, an absolute value of a difference between the reflection chromaticity $b_1^*$ of the electrode surface of one side thereof and the reflection chromaticity $b_2^*$ of the electrode surface of the other side may be regulated to not more than 2($|\Delta b^*|=|b_1^*-b_2^*|\leq 2$). This is because in the case where patterned electrodes are formed on the both surfaces of a single sheet of transparent support, the electrode surface of one side (reflection chromaticity $b_1^*$) and the surface of the electrode of the other side coming into contact with the support (reflection chromaticity $b_2^*$) are viewed by a touch panel user, and a difference in reflection chromaticity between the both surfaces is sometimes seen as color unevenness. Thus, it is preferable to adjust the reflection chromaticities as described above.

Next, in the present invention, the patterned electrode formed on the transparent support is described while correlating with a capacitive touch panel for which the transparent electrode sheet according to the present invention is preferably used. In the conventional capacitive touch panels, ITO thin films that are a transparent electrode material as an electrode material have been used as a bar electrode. However, in the present invention, since the electrode is formed through a combination of conductive thin wires using a material having a lower resistance than ITO, this is called the patterned electrode. The foregoing low-resistance material is an opaque material, and metal materials such as gold, silver, copper, etc. are used.

In the capacitive touch panel using the transparent electrode sheet according to the present invention, for example, as shown in a cross-sectional view of FIG. 1, two sheets of electrodes are disposed so as to oppose each other via an insulating layer 41. In FIG. 1, conductive thin wires 21 of an upper electrode are formed under an upper electrode sheet 11, and conductive thin wires 22 of a lower electrode are formed above a lower electrode sheet 12.

Figure 8:
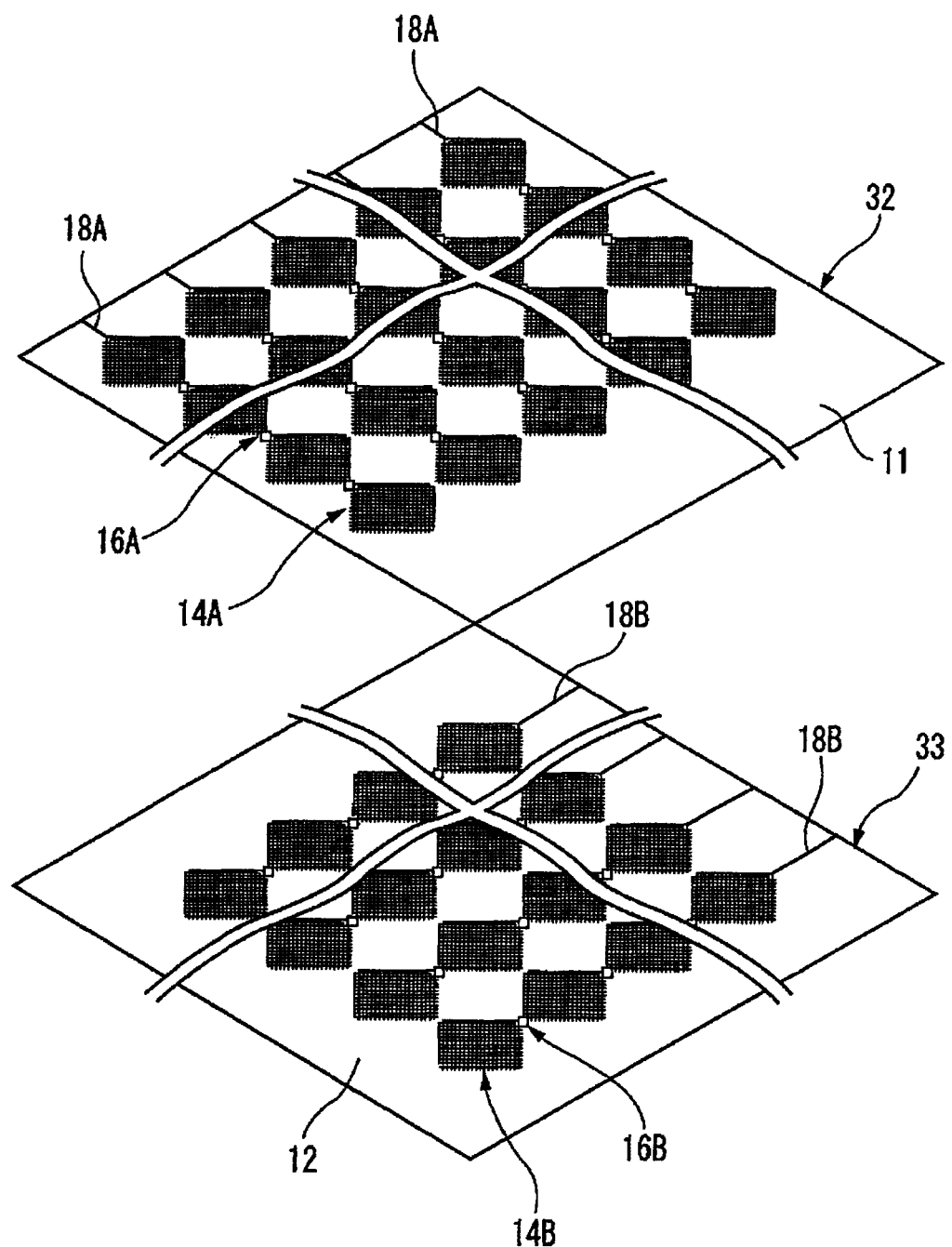
FIG. 8 is an oblique view of a stack of an upper electrode sheet 11 and a lower electrode sheet 12 (an insulating layer 41 is omitted).

FIG. 8 is an oblique view of a stack of the upper electrode sheet 11, the insulating layer 41, and the lower electrode sheet 12, in which the insulating layer 41 is, however, omitted for the purpose of simplification. Plural electrodes constituting the upper electrode sheet 11 and the lower electrode sheet 12 are made from plural conductive lattice sections 14A and 14B in which each electrode senses a capacitance and conductive connection sections 16A and 16B connecting a lattice and a lattice to each other, and these electrodes and external control sections are connected to each other by leader lines 18A and 18B. In FIG. 8, though the conductive lattice sections are shown in a mesh-like form, a pattern in which diamond-shaped transparent conductive films made of ITO or the like are coupled (called a "diamond pattern") may be thinned and used, too. In FIG. 8, the upper electrode sheet 11 and the lower electrode sheet 12 are disposed such that the conduction directions of the electrodes are substantially orthogonal to each other. In each of the electrodes of the upper electrode sheet 11 and the lower electrode sheet 12, the number of electrodes and the number of conductive lattice sections may be changed by a size of the panel or easiness of the control.

Figure 9:
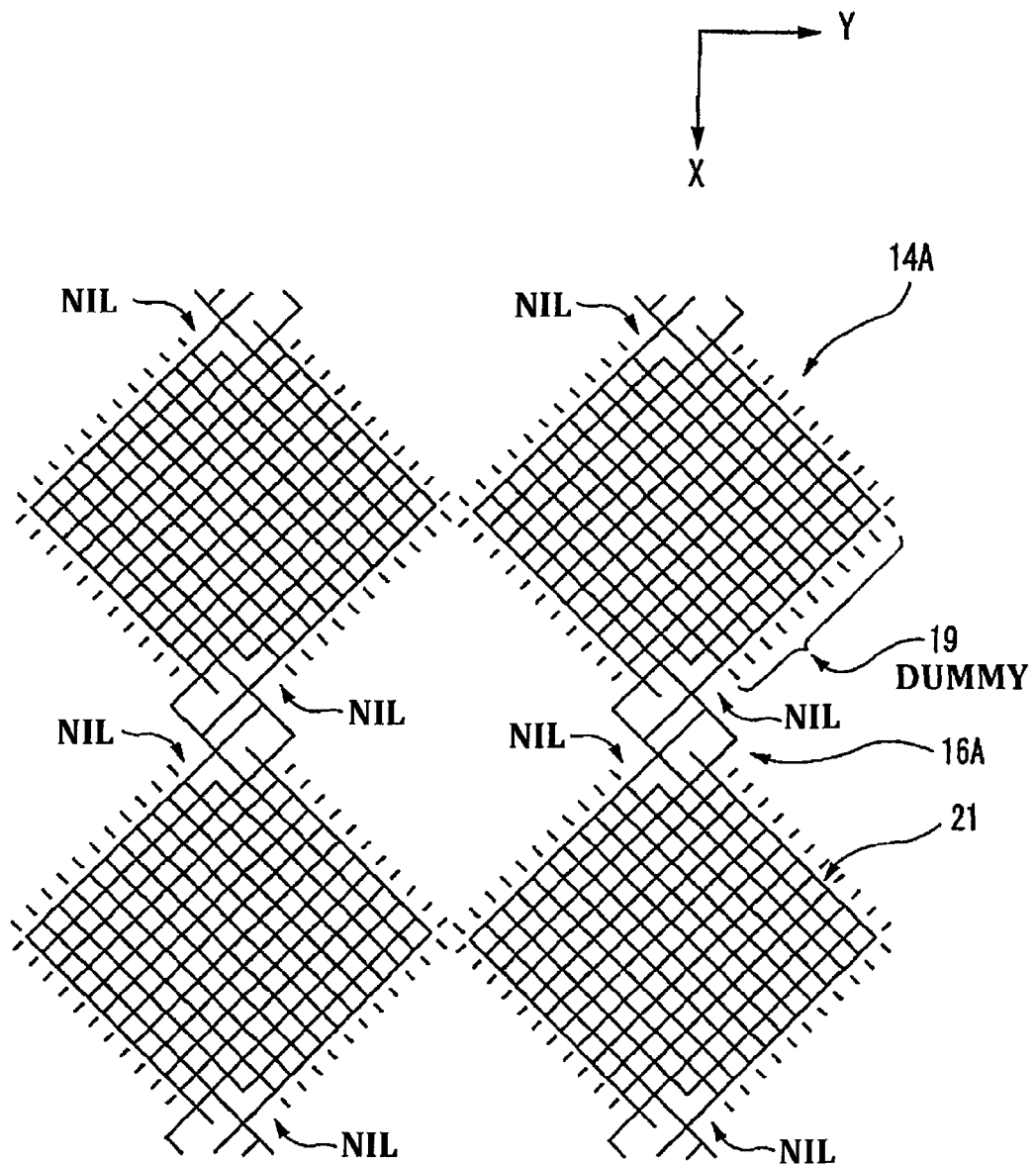
FIG. 9 is a view explaining a conductive lattice section and a connection section of the upper electrode sheet shown in FIG. 8.
Figure 10:
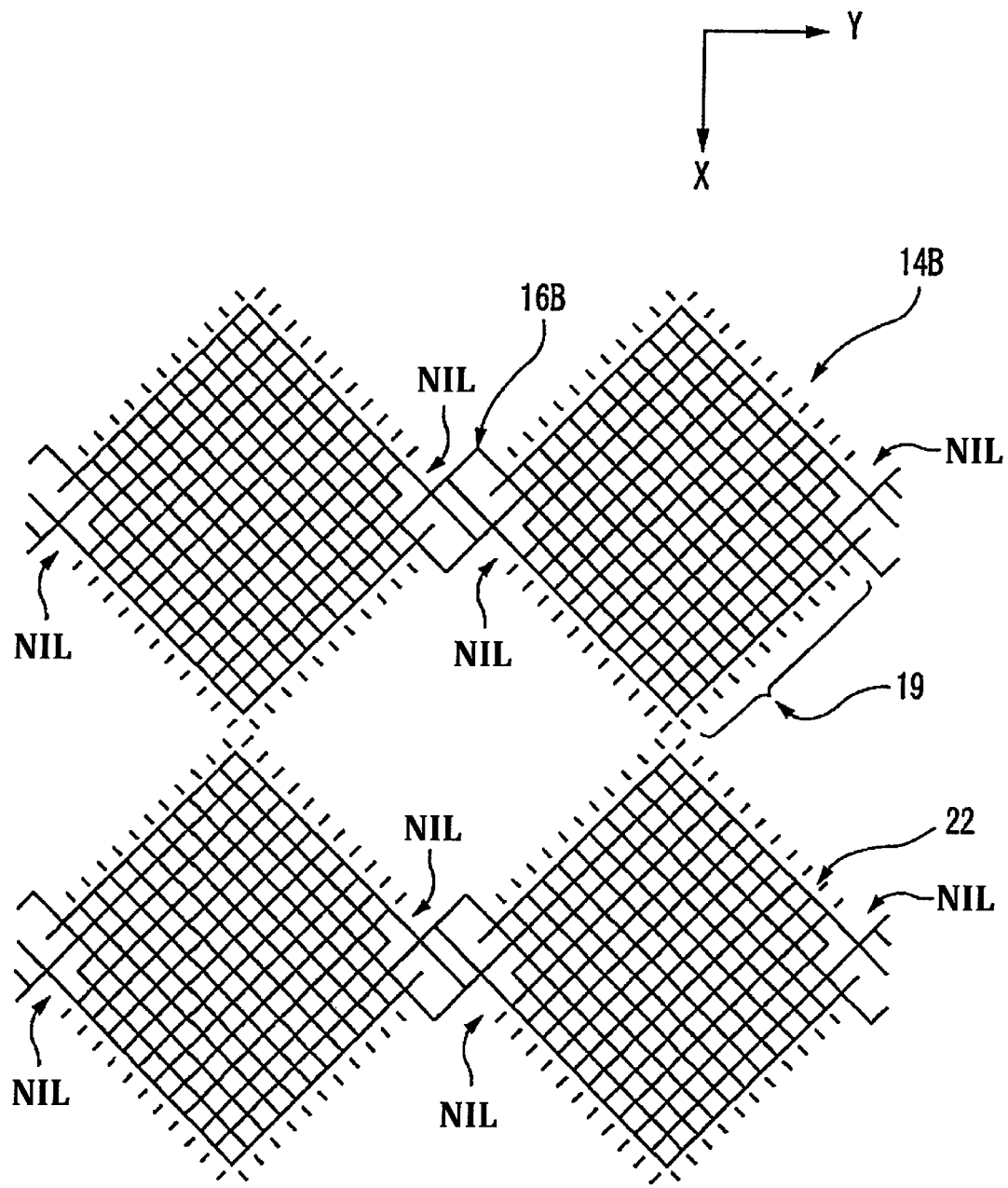
FIG. 10 is a view explaining a conductive lattice section and a connection section of the lower electrode sheet shown in FIG. 8.

FIGS. 9 and 10 are views in which the conductive lattice sections 14A and 14B and the conductive connection sections 16A and 16B connecting a lattice and a lattice to each other of the upper electrode sheet 11 and the lower electrode sheet 12 shown in FIG. 8 are taken out, respectively. In the conductive lattice section 14A, a square lattice constituted of the conductive thin wires 21, a dummy thin wire 19 disposed in the surroundings of the square lattice and composed of a large number of short wires, and the conductive connection section 16A connecting the conductive lattice sections 14A to each other in the electrode direction are described. In order to prevent the matter that the electrode does not function due to an unexpected disconnection fault from occurring, the conductive connection section 16A is constructed by connection with plural thin wires but not connection with a single thin wire.

With respect to the conductive lattice sections 14B and 16B shown in FIG. 10, the same explanation as that in the foregoing conductive lattice sections 14A and 16A can be applied.

Incidentally, the constitution of the capacitive touch panel using the transparent electrode sheet according to the present invention is not limited to the foregoing embodiment, there is exemplified a type in which the two electrodes are disposed orthogonal to each other in the X-Y directions, a so-called X-Y matrix type.

Figure 11:
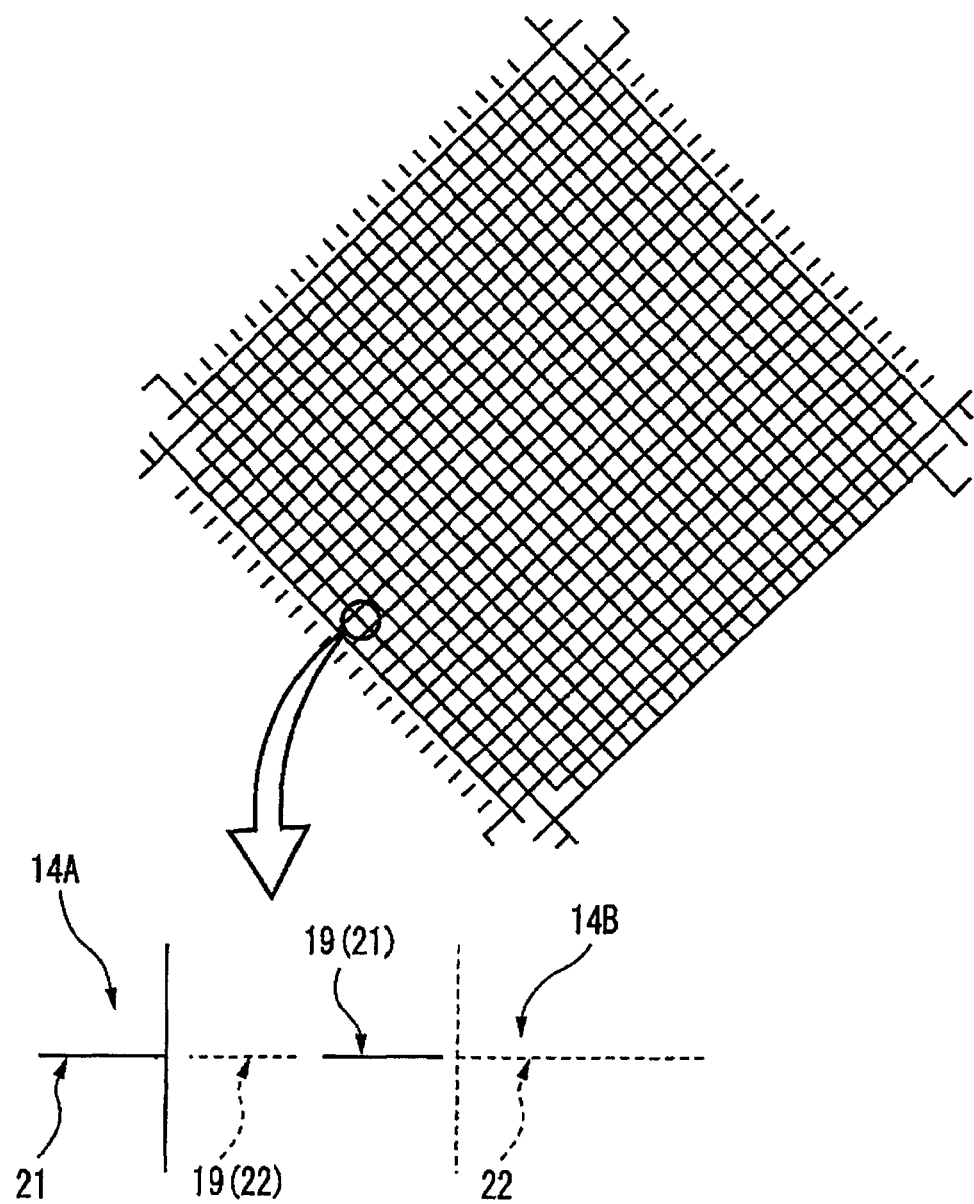
FIG. 11 is a perspective view from the side of a touch panel user at the time of stacking an upper electrode sheet and a lower electrode sheet.

FIG. 11 shows the appearance of electrode wires in the case where FIG. 8 is seen through from the side of a touch panel user. In FIG. 11 using the upper electrode sheet 11 and the lower electrode sheet 12 according to the present invention, a uniform square lattice is revealed, whereby a panel which is viewed easily can be constituted. Incidentally, in FIG. 11, though the lattice is seen to be formed of straight lines, there are a straight line portion and a portion of two short lines. This is shown in a lower drawing which is an enlarged portion of a portion marked with a circle in FIG. 11. A left-side solid line part stands for a part of the conductive thin wire 21 of the conductive lattice section 14A of the upper electrode sheet, and similarly, the solid line 19 (21) is a dummy thin wire in the surroundings of the conductive lattice section 14A. Similarly, a right-side dotted part stands for a part of the conductive thin wire 22 of the conductive lattice section 14B of the lower electrode sheet, and similarly, the dotted line 19 (22) is a dummy thin wire in the surroundings of the conductive lattice section 14B. In this way, even though visually seen as a single straight line, in fact, the conductive thin wires 21 and 22 do not conduct to each other and do not conduct to the dummy thin wire 19, too.

As can be understood from the foregoing, the dummy thin wire 19 which is used in the present invention is a thin wire to be used for the purpose of improving the visibility, and as shown in FIGS. 9 and 10, the dummy thin wire is formed on the extension of both ends of a long line of the square lattice and is disconnected such that it does not conduct to the conductive lattice section. A length of the dummy thin wire is not more than a half of the side length of the unit lattice of the electrode portion.

Details of the electrode are hereunder described by reference to the upper electrode sheet 11 as an example. The diamond pattern of ITO which has formed the conventional electrode is difficult to be applied to a large screen because a resistance value of ITO is high. In the present invention, the diamond portion is formed of a mesh or lattice of a low-resistance thin wire (for example, a metal material such as gold, silver, copper, etc.), thereby guaranteeing low resistance and brightness of the screen. The square lattice is hereunder described, but the use of a rectangular lattice or the like is not impaired.

A wire width of the conductive thin wire forming the conductive lattice section is not more than 10 μm, preferably 1 μm or more and not more than 10 μm, and more preferably 1 μm or more and not more than 6 μm. When the wire width is in the range of 1 μm or more and not more than 10 μm, a low-resistance electrode can be relatively easily formed.

A thickness of the conductive thin wire forming the conductive lattice section is preferably 0.1 μm or more and not more than 1.5 μm, and more preferably 0.2 μm or more and not more than 0.8 μm. When the thickness is in the range of 0.1 μm or more and not more than 1.5 μm, a low-resistance electrode which is also excellent in term of durability can be relatively easily formed.

In the present invention, a length of one side of the conductive lattice sections 14A and 14B is preferably from 3 to 10 mm, and more preferably from 4 to 6 mm. When the length of one side is from 3 to 10 mm, problems such as a possibility of detection failure to be caused due to a shortage of sensing capacitance and a lowering of position detection precision are hardly caused. From the same viewpoint, a length of one side of the unit lattice constituting the conductive lattice section is preferably from 50 to 500 μm, and more preferably from 150 to 300 μm. In the case where the length of the side of the unit lattice falls with the foregoing range, it is also possible to keep the transparency good, and at the time of installation on the front of a display device, the display can be viewed without feeling out of place.

Incidentally, in the upper and lower electrodes of the touch panel shown in FIG. 8, the conduction directions are substantially orthogonal to each other. However, the conduction directions can be set up at an arbitrary angle so long as there is no hindrance in coordinate determination of a touching position.

Furthermore, the direction of the conductive thin wires constituting the square lattices illustrated in FIGS. 9 and 10 is the 45-degree direction against the X and Y axes. The touch panel according to the present invention has such a characteristic feature that when sticking is performed while making the X and Y directions of this panel as the directions of the electrode axes of an image display device, moire is hardly caused.

In the electrode sheet constituted of the thus patterned electrode, it is possible to significantly reduce the electrical resistance (for example, evaluated by measuring the surface resistance) as compared with a constitution in which one electrode is formed of one ITO film. In consequence, in the case of applying the electrode sheet according to the present invention to, for example, a projected capacitive touch panel, the response speed can be hastened, and the increase in size of the touch panel can be accelerated.

As for a method for manufacturing the electrode sheet according to the present invention, a conductive pattern made from metal thin wires may be, for example, formed by exposing a photosensitive material having an emulsion layer containing a photosensitive silver halide salt on a transparent substrate and subjecting the exposed photosensitive material to a development treatment, thereby forming a metallic silver part and a light transmitting part in an exposed area and an unexposed area, respectively.

In addition, a conductive pattern made from metal thin wires may also be formed by exposing and developing a photoresist film on a copper foil formed on a transparent substrate to form a resist pattern and etching the copper foil exposed from the resist pattern.

In addition, a conductive pattern made from metal thin wires may also be formed by printing a paste containing metal fine particles on a transparent substrate and subjecting the paste to metal plating.

In addition, a conductive pattern made from metal thin wires may also be printed and formed with a screen printing plate or a gravure printing plate on a transparent substrate.

In addition, a conductive pattern made from metal thin wires may also be formed by forming a photosensitive layer to be plated on a transparent substrate by using a pretreatment material and after exposure and development treatment, subjecting the resultant to a plating treatment, thereby forming a metal part and a light transmitting part in an exposed area and an unexposed area, respectively. Examples of more preferred embodiments of using the plating pretreatment material include the following two embodiments (1) and (2). Incidentally, more specific contents of the following are disclosed in JP-A-2003-213437, JP-A-2006-64923, JP-A-2006-58797, JP-A-2006-135271, and the like.

(1) An embodiment of coating a layer to be plated containing a functional group capable of interacting with a plating catalyst or a precursor thereof on a transparent substrate and after exposure and development, subjecting the resultant to a plating treatment, thereby forming a metal part on the material to be plated.

(2) An embodiment of stacking a base layer containing a polymer and a metal oxide and a layer to be plated containing a functional group capable of interacting with a plating catalyst or a precursor thereof in this order on a transparent substrate and after exposure and development, subjecting the resultant to a plating treatment, thereby forming a metal part on the material to be plated.

In the electrodes manufactured by the foregoing methods, since the constituent materials are opaque, reflection occurs on the electrode surface, and its degree of reflection is different between the near side to the transparent support and the far side from the transparent support. Though the difference in a degree of reflection affects the visibility, by controlling the degree of reflection as described above, it becomes possible to provide a conductive sheet with high visibility.

In the present invention, a photosensitive layer containing a silver halide emulsion as a forming material of conductive thin wires constituting the above-described pattern electrode is formed on a transparent support, and after going through patternwise exposure as described below, the resultant is subjected to development and fixing treatments, thereby fabricating a transparent electrode sheet.

In the case where the developed silver electrode has a high density of silver, the above-described color unevenness on the front and rear surfaces of the electrode is remarkable. In the case where a volume ratio of silver and a binder contained in the silver halide emulsion layer (silver/binder ratio) is 1.0 or more, the color unevenness occurs easily. In the case where low-resistance conductive thin wires are formed by a development system, the silver/binder volume ratio is an essential factor. In the present invention, in the case of regulating the thin wire width to not more than 10 μm as described below, it is preferable that the electrode has a layer having a silver/binder volume ratio of 1.0 or more. The silver/binder volume ratio is more preferably 1.0 or more and not more than 10, still more preferably 1.5 or more and not more than 8.0, and especially preferably 2.0 or more and not more than 6.0. When the electrode has a layer having a silver/binder volume ratio of 1.0 or more, it is possible to obtain an electrode of a pattern with higher conductivity.

In the present invention, the silver/binder volume ratio is determined by calculating a mass of silver and a mass of the binder contained in the silver halide emulsion layer and calculating a density of silver as 10.5 and a density of the binder as 1.34, respectively. However, in the case where the gelatin amount in the binder is not more than 50% by mass, components other than gelatin are calculated while taking respective densities thereof into account.

Next, the transparent support and the photosensitive layer containing a silver halide emulsion constituting the transparent electrode sheet according to the present invention are described.

[Transparent Support]

As the transparent support constituting the transparent electrode sheet according to the present invention, plastic films, plastic plates, glass plates, and the like can be used, with plastic films being preferable.

As raw materials of the plastic film, for example, polyesters such as polyethylene terephthalate (PET), polyethylene naphthalate (PEN), etc.; polyolefins such as polyethylene (PE), polypropylene (PP), polystyrene, etc.; vinyl chloride-based resins such as polyvinyl chloride, polyvinylidene chloride, etc.; and besides, polyetheretherketone (PEEK), polysulfone (PSF), polyether sulfone (PES), polycarbonate (PC), polyamides, polyimides, acrylic resins, triacetyl cellulose (TAC), and the like can be used.

In the present invention, though the plastic film can be used as a single layer, it is also possible to use the plastic film as a multilayer film composed of a combination of two or more layers.

As the support, plastic films having a melting point of not higher than about 290° C., such as PET (258° C.), PEN (269° C.), PE (135° C.), PP (163° C.), polystyrene (230° C.), polyvinyl chloride (180° C.), polyvinylidene chloride (212° C.), TAC (290° C.), etc., are preferable, with PET being especially preferable. The numerical values in the parentheses are a melting point. A transmittance of the film is preferably from 85% to 100%.

A thickness of the transparent support film can be arbitrarily chosen within the range of 50 μm or more and not more than 500 μm. In particular, in the case where the transparent support film also serves as a function of a touch surface in addition to the function of the support of the transparent electrode sheet, it is also possible to design the transparent support film in a thickness exceeding 500 μm. In the case of providing the photosensitive layer containing a silver halide emulsion on a transparent support in a coating system, a thickness of the film is more preferably 50 μm or more and not more than 250 μm in view of manufacture.

[Photosensitive Layer Containing Silver Halide Emulsion]

Next, the photosensitive layer containing a silver halide emulsion is described. However, in order to make the developed silver as an electrode material, the kind of a photosensitive material and the kind of a development treatment can be chosen from the following three systems.

(1) A system in which a photosensitive silver halide black-and-white photosensitive material not containing a physical development nucleus is subjected to chemical development or thermal development, thereby forming a metallic silver part on the photosensitive material.
(2) A system in which a photosensitive silver halide black-and-white photosensitive material containing physical development nuclei in a silver halide emulsion layer is subjected to dissolution physical development, thereby forming a metallic silver part on the photosensitive material.
(3) A system in which a photosensitive silver halide black-and-white photosensitive material not containing a physical development nucleus and an image receiving sheet having a non-photosensitive layer containing physical development nuclei are superimposed and subjected to diffusion transfer development, thereby forming a metallic silver part on the non-photosensitive image receiving sheet.

The foregoing embodiment (1) is of a black-and-white development type, and a translucent conductive film such as a translucent electromagnetic wave shielding film, etc. is formed on the photosensitive material. The obtained developed silver is chemically developed silver or thermally developed silver and is a filament with a high specific surface. Furthermore, in the case of providing a plating treatment or a succeeding process to the physical treatment, this embodiment is a preferred system with high activity.

In the foregoing embodiment (2), in the exposed area, the silver halide grains around the physical development nuclei are melted and deposited on the development nuclei, whereby a translucent conductive film such as a translucent magnetic wave shielding film, a light transmitting conductive film, etc. is formed on the photosensitive material. This is also of a black-and-white development type. Though high activity is obtained because the development action is concerned with deposition onto the physical development nuclei, the obtained developed silver has a spherical shape with a small specific surface.

In the foregoing embodiment (3), in an unexposed area, the silver halide grains are melted and diffused to deposit on the development nuclei on the image receiving sheet, whereby a translucent conductive film such as a translucent magnetic wave shielding film, a light transmitting conductive film, etc. is formed on the image receiving sheet. This embodiment is of a so-called separate type of two sheets and is an embodiment in which the image receiving sheet is peeled off from the photosensitive material and used.

In all of these embodiments, any development of a negative type development treatment or a reversal development treatment can be chosen (in the case of a diffusion transfer system, it becomes possible to carry out the negative type development treatment using an auto-positive type photosensitive material as the photosensitive material).

The chemical development, thermal development, dissolution physical development, and diffusion transfer development as referred to herein have the same meanings as those in generally used terminologies in the art of photographic photosensitive materials and are explained in common photographic chemistry texts, for example, Shin-ichi Kikuchi, *Shashin Kagaku* (Photographic Chemistry) (published by Kyoritsu Shuppan Co., Ltd.) and C. E. K. Mees, *The Theory of Photographic Processes,* 4th ed. (published by Mcmillan in 1977). In addition, for example, reference can also be made to techniques described in JP-A-2004-184693, JP-A-2004-334077, JP-A-2005-010752, and the like.

Among the foregoing systems (1) to (3), the system (1) is the simplest, is able to carry out the stable treatment, and is preferable for manufacturing the transparent electrode sheet according to the present invention in view of the facts that the system (1) is free from a physical development nucleus in the photosensitive layer before the development and is not a diffusion transfer system of two sheets. Though the system (1) is hereunder described, in the case of adopting other systems, reference can be made to the documents as described above. Incidentally, the "dissolution physical development" is not a development method inherent to only the system (2) but a development method which can also be utilized in the system (1).

(Silver Halide Emulsion)

In the present invention, the halogen element which is contained in the silver halide emulsion may be any of chlorine, bromine, iodine, or fluorine, and a combination thereof may also be used. For example, a silver halide composed mainly of silver chloride, silver bromide, or silver iodide is preferably used, and a silver halide composed mainly of silver bromide or silver chloride is more preferably used. Silver chlorobromide, silver iodochlorobromide, and silver iodobromide are also preferably used. Silver chlorobromide, silver bromide, silver iodochlorobromide, and silver iodobromide are more preferably used, and silver chlorobromide and silver iodochlorobromide each containing 50% by mole or more of silver chloride are most preferably used.

Incidentally, the "silver halide composed mainly of silver bromide" as referred to herein means a silver halide in which a mole fraction of a bromide ion occupying in the silver halide composition is 50% or more. This silver halide grain composed mainly of silver bromide may contain, in addition to a bromide ion, an iodide ion or a chloride ion.

Incidentally, the silver iodide content in the silver halide emulsion is preferably in the range of not exceeding 1.5% by mole per mole of the silver halide emulsion. By regulating the silver iodide content to the range not exceeding 1.5% by mole, fogging can be prevented from occurring, and pressure properties can be improved. The silver iodide content is more preferably not more than 1% by mole per mole of the silver halide emulsion.

With respect to an average grain size of the silver halide and the shape, degree of dispersion, and coefficient of variation of the silver halide grain, reference can be made to the descriptions in paragraphs 36 and 37 of JP-A-2009-188360. In addition, with respect to utilization of metallic compounds belonging to the Group VIII and Group VIIB, which are used for stabilization or sensitivity increase of the silver halide emulsion, such as rhodium compounds, iridium compounds, etc., and palladium compounds, reference can be made to the descriptions in paragraphs 39 to 42 of JP-A-2009-188360. Furthermore, with respect to chemical sensitization, reference can be made to the technical description in paragraph 43 of JP-A-2009-188360.

The silver halide emulsion which is used in the present invention is preferably a silver chlorobromide emulsion. In addition, in order to suppress the occurrence of fogging before or during the development, it is preferable to contain a small amount of silver iodide, and it is more preferable to contain about 0.5% by mole of silver iodide. In the following, even when silver iodide is contained in an amount of the above-described degree, such is not particularly expressed.

Figure 7:
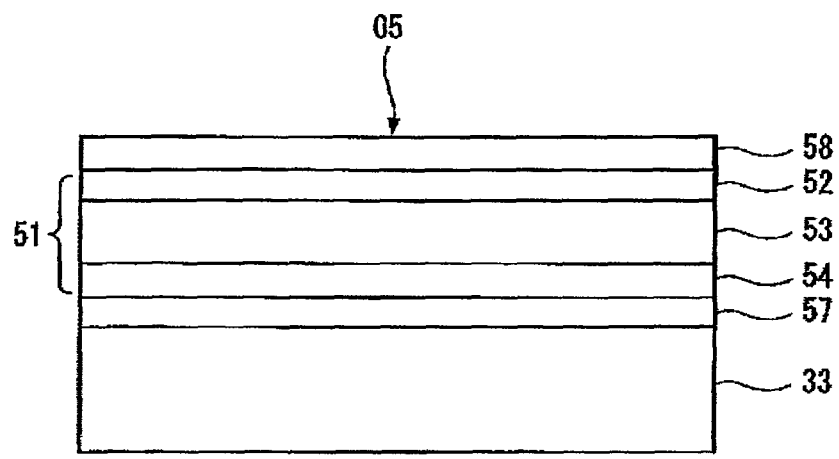
FIG. 7 is an enlarged cross-sectional view of a photosensitive material layer containing a silver halide emulsion.

In the present invention, in order to adjust a reflection chromaticity of the surface of the conductive thin wire of developed silver formed after the development on the far side from the support and a reflection chromaticity of the surface of the thin wire on the near side to the transparent support, as shown in FIG. 7, a photosensitive layer 51 is formed by coating as a photosensitive layer upper layer 52, a photosensitive layer central layer 53, and a photosensitive layer lower layer 54. The technique of constituting the photosensitive layer while separating it into multiple layers is the same as a method of constituting an emulsion layer of a silver halide photographic photosensitive material as an o-layer, an m-layer, and a u-layer in descending order of photosensitivity. By achieving the multi-layer formation in this way, the sensitivity and gradation and the like can be easily adjusted. In the present invention, for the sake of convenience in understanding the layers, the photosensitive layer upper layer 52 is abbreviated as an o-layer, the photosensitive layer central layer 53 is abbreviated as an m-layer, and the photosensitive layer lower layer 54 is abbreviated as a "u-layer"; however, this does not express the level of sensitivity. The o-layer that is the photosensitive layer upper layer 52 is a photosensitive layer of the surface side farthest from the transparent support, and the u-layer that is the photosensitive lower layer 54 is a photosensitive layer of the surface side nearest to the transparent support. It is preferable to form such a photosensitive layer of three-layer constitution (o-layer/m-layer/u-layer) by a multilayer simultaneous coating system.

In the present invention, a thickness of the foregoing photosensitive layer (o-layer/m-layer/u-layer) can be set up to 1/2/1 in terms of a coated silver amount or 1/2/1 in terms of a thickness ratio. It is convenient that in the case where the silver/binder volume ratio in the photosensitive layer is constant, a coated silver amount ratio of 1/2/1 is used, whereas in the case where the silver/binder volume ratio is changed among the three layers, a thickness ratio of 1/2/1 is used. Incidentally, in the foregoing description, while the photosensitive layer is constituted of three layers, it can be constituted of arbitrary layers of two or more layers depending upon the purpose. In addition, with respect to the thickness of each layer, when the o-layer and the u-layer are considered as a cover layer of the m-layer, it is preferable that the m-layer occupies from 40 to 90% of the whole of the photosensitive layer, and the residue can be distributed for the o-layer and the u-layer.

A protective layer 58 may be formed on the photosensitive layer 51 containing a silver halide emulsion, and an undercoat layer 57 may be formed between a transparent support 33 and the photosensitive layer 54.

Figure 13:
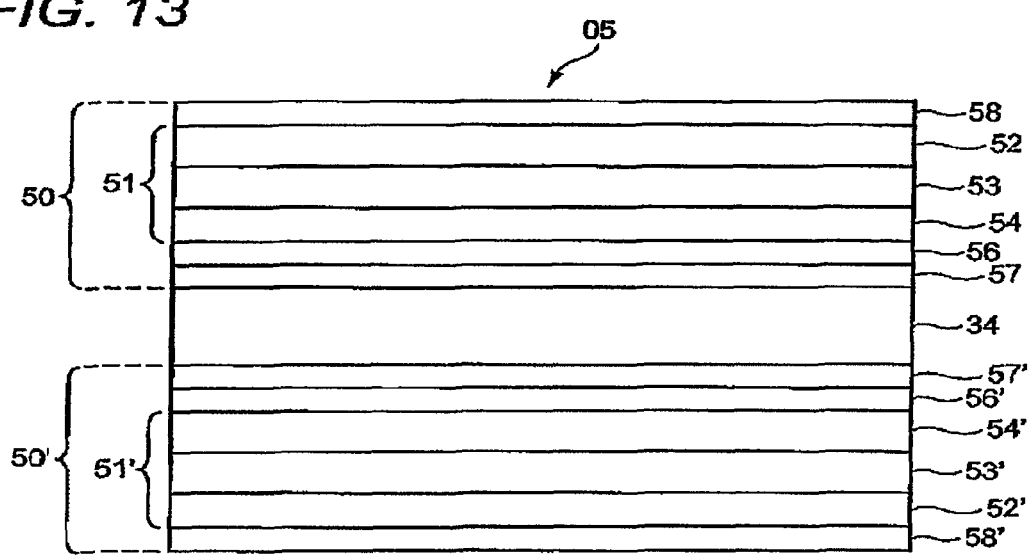
FIG. 13 is an enlarged cross-sectional view of an embodiment having a photosensitive material layer containing a silver halide emulsion on the both surfaces of a transparent support.

In addition, in the case where patterned electrodes are formed on the both surfaces of a single sheet of transparent support, photosensitive layers which are different between the both surfaces of the transparent support from each other can be coated and formed, and photosensitive layers which have the same composition as each other can also be formed on the front surface and the rear surface, and thus, a degree of freedom for designing can be widened. FIG. 13 is a schematic view of a double-sided photosensitive material having photosensitive layers on the both surfaces of a transparent support, and the photosensitive layer 51 having the same three-layer constitution as that in the above-described explanation of FIG. 7 is formed on the both sides of a support 34. The photosensitive layers 51 and 51' may be the same as or different from each other. The case where the photosensitive layers 51 and 51' are different from each other includes the case where only one layer of the three layers, for example, the layers 52 and 52' that are the o-layer, is different.

It is necessary to subject the double-sided electrode formed from the double-sided photosensitive material to exposure for electrode formation on the both front and rear surfaces such that when seen through, the pattern of electrode thin wires on the both front and rear surfaces forms a uniform lattice pattern as shown in FIG. 11. Accordingly, the exposure patterns on the both front and rear surfaces are a pattern different from each other in terms of at least the conduction direction of electrode. In the case where the exposure is applied from the two directions of the photosensitive layers 51 and 51', an apparatus illustrated in FIG. 14 can be used. In the double-sided photosensitive material in the case of carrying out double-sided exposure, an anti-halation layer 56 is provided between the undercoat layer 57 and the photosensitive layer 54 on the transparent support, whereby mixing of light at the simultaneous exposure can be prevented from occurring.

Preferred embodiments of the respective layers of the photosensitive layer for adjusting the reflection chromaticity are hereunder described. In a system as in the present invention, in which not only the amount of silver is increased for achieving a low resistance, but the density of silver is increased for the purpose of imparting conductivity to a silver image formed upon development, the color tint on the electrode surface of the far side from the transparent support of the developed silver electrode tends to become bluish, whereas the color tint on the electrode surface of the near side to the transparent support of the developed silver electrode tends to become yellowish.

As for a cause of this color tint phenomenon, in the system in which not only the silver amount is high, but the silver density is high, it may be considered that following the penetration of a developing solution from the surface of the photosensitive layer of the far side from the transparent support, the development proceeds with a fresh developing solution composition on the surface side, whereas following the penetration of the developing solution toward the lower layer in the photosensitive layer, accumulation of a development fatigue substance occurs, and a development inhibitor contained in the developing solution is consumed in the surface layer, and hence, the development proceeds with a solution composition having a small amount of the inhibitor. Following this, it may be assumed that a difference is caused in the shape or size of filaments of the developed silver between the upper layer side and the lower layer side of the photosensitive material and observed as a chromaticity difference. According to such assumption, the following embodiments are preferable in the present invention.

In the silver chlorobromide emulsion which is used in the present invention, it is preferable that a solubility of the silver halide emulsion of the photosensitive layer of the surface side near to the transparent support in the developing solution is lower than a solubility of the silver halide emulsion of the photosensitive layer of the surface side far from the transparent support in the developing solution. Thus, the silver bromide content is preferably 10% or more and not more than 50%. By setting up the silver bromide content in this manner, the difference in color tint can be controlled small.

Furthermore, it is preferable that the silver bromide content of the silver chlorobromide emulsion of the photosensitive layer (u-layer) of the near side to the transparent support is higher than the silver bromide content of the photosensitive layer (o-layer) of the surface side far from the transparent support, and it is preferable that the silver bromide content of the u-layer is higher by 10% or more than the silver bromide content of the o-layer. In the case where such a difference is less than 10%, the improvement in the difference of color tint is difficult.

When the volume ratio of silver to the binder is 1.0 or more, a difference between the color tint of the surface of the developed silver electrode of the near side to the transparent support and the color tint of the surface of the far aside from the transparent support is easily viewed. However, by regulating the volume ratio of silver to the binder contained in the photosensitive layer (u-layer) of the near side to the transparent support to less than 1.0, the foregoing difference in color tint can be improved. Furthermore, it is more preferable to regulate the volume ratio of silver to the binder to less than 0.5.

Furthermore, the volume ratio of silver to the binder contained in each of the photosensitive layer (u-layer) of the near side to the transparent support and the photosensitive layer (o-layer) of the far side from the transparent support is more preferably less than 1.0, and especially less than 0.5.

For the purposes of uniformly dispersing the silver salt grains and assisting close adhesion between the emulsion layer and the support, a binder is used in the silver halide emulsion layer. Examples of the binder include gelatin, carrageenan, polyvinyl alcohol (PVA), polyvinylpyrrolidone (PVP), saccharides such as starch, cellulose and derivatives thereof, polyethylene oxide, polysaccharide, polyvinylamine, chitosan, polylysine, polyacrylic acid, polyalginic acid, polyhyaluronic acid, carboxy cellulose, gum arabic, sodium alginate, and the like, with gelatin being preferable, As the gelatin, in addition to lime-processed gelatin, an acid-process gelatin may be used, too. A hydrolysis product of gelatin, an enzyme-decomposed product of gelatin, and besides, gelatins obtained by modifying an amino group or a carboxyl group (for example, phthalated gelatin or acetylated gelatin) can be used.

In addition, a latex can also be used as the binder. Here, as the latex, polymer latexes described at page 18, left-hand lower column, lines 12 to 18 of JP-A-2-103536 can be preferably used.

In the present invention, it is preferable that the photosensitive layer containing a silver halide emulsion contains at least one mercapto compound. Examples of the mercapto compound include alkyl mercapto compounds, aryl mercapto compounds, heterocyclic mercapto compounds, and the like. As for the compound which can be used in the present invention, compounds described in paragraphs 34 to 102 of JP-A-2007-116137 can be used.

Among the compounds described in paragraphs 34 to 102 of JP-A-2007-116137, mercapto compounds comprising, as a skeleton, a 5-membered ring azole having an N—H structure or a 6-membered ring azine having an N—H structure are preferable. The N—H structure as referred to herein means a nitrogen-hydroxy bond contained in the azole or azine, and the hydrogen is characterized by being dissociable.

Though the 5-membered ring azole or 6-membered ring azine serving as a skeletal structure of the mercapto compound may be monocyclic, the case where it is a complex heterocyclic ring in which two or more rings are fused is preferable. A preferred structure of the complex heterocyclic ring may be a composite ring (fused ring) of a 5-membered ring azole or 6-membered ring azine with a hetero atom-free benzene ring or the like, or may be a composite ring (fused ring) of a 5-membered ring azole and a 6-membered azine. More specifically, the ring structure is preferably a composite ring in which each ring of pyridine, pyrazole, imidazole, or phenyl is fused is preferable. The ring structure is especially preferably benzoimidazole or benzopyrazole.

The foregoing ring may contain, in addition to the mercapto group, a hydroxyl group, a sulfo group, a carboxyl group, a nitro group, a halogen atom (for example, a chlorine atom or a bromine atom), an aryl group (for example, a phenyl group, a 4-methanesulfonamidophenyl group, a 4-methylphenyl group, a 3,4-dichlorophenyl group, or a naphthyl group), an aralkyl group (for example, a benzyl group, a 4-methylbenzyl group, or a phenethyl group), a sulfonyl group (for example, a methanesulfonyl group, an ethanesulfonyl group, or a p-toluenesulfonyl group), a carbamoyl group (for example, an unsubstituted carbamoyl group, a methylcarbamoyl group, or a phenylcarbamoyl group), or a sulfamoyl group (for example, an unsubstituted sulfamoyl group, a methylsulfamoyl group, or a phenylsulfamoyl group). It is preferable that the ring contains a sulfo group or a carboxyl group. Such a water-soluble group may also be of a structure of an alkali metal salt.

Among these mercapto compounds, examples of compounds which are preferably used in the present invention include 39 compounds described in paragraphs 60 to 65, 55 compounds described in paragraphs 90 to 93, and 3 compounds described in paragraph 101, of JP-A-2007-116137 as described above. Among these compounds, compounds which can be more preferably used in the present invention are the compounds described in paragraphs 60, 65 and 101.

Among the foregoing mercapto compounds, compounds having, as a substituent, an $SO_3M$ group at any one of from the 4-position to the 7-position of 2-mercaptobenzoimidazole and further having, as a substituent, at least one member selected from a hydrogen atom, a hydroxyl group, a lower alkyl group, a lower alkoxy group, a carboxyl group, a halogen group, and a sulfo group, wherein M is an alkali metal atom or an ammonium group, are the most preferable. The three compounds described in paragraph 101 are especially preferable.

In the present invention, though the mercapto compound which is contained in the photosensitive layer may be uniformly contained in the photosensitive layer, it is preferable that the content of the mercapto compound in the photosensitive layer is higher in the photosensitive layer (u-layer) of the near side to the transparent support. Furthermore, it is more preferable that the mercapto compound is contained only in the photosensitive layer of the transparent support side, in other words, the mercapto compound is localized in the farthest layer from the photosensitive layer surface coming into the developing solution in this way. Alternatively, it is preferable to increase the concentration of the mercapto compound successively toward the layer far from the photosensitive layer surface coming into contact with the developing solution.

In the present invention, the amount of the mercapto compound contained in at least one of the plural photosensitive layers is preferably 0.1 mg or more and not more than 15 mg, more preferably 0.5 mg or more and not more than 10 mg, and especially preferably 1 mg or more and not more than 6 mg, per gram of silver in the silver halide emulsion contained in the same layer in which the mercapto compound is contained. When the amount of the mercapto compound is in the range of 0.1 mg or more and not more than 15 mg, it is easy to adjust the color tint.

In the present invention, a dye for adjusting the color tint can also be contained in the photosensitive layer or an adhesive layer or an undercoat layer. In addition, in the present invention, a dye layer can also be provided as an anti-halation layer between the photosensitive layer and the transparent support, or between the photosensitive layer and the undercoat layer. With respect to the dye to be used for these layers and a method for using the same, reference can be made to the descriptions in paragraphs 29 to 32 of JP-A-2009-188360.

In the present invention, though the solvent which is used for forming the photosensitive layer is not particularly limited, examples thereof include water, organic solvents (for example, alcohols such as methanol, etc., ketones such as acetone, etc., amides such as formamide, etc., sulfoxides such as dimethyl sulfoxide, etc., esters such as ethyl acetate, etc., ethers, or the like), ionic liquids, and mixed solvents thereof.

The content of the solvent other than water, which is used for the photosensitive layer, is in the range of from 30 to 90% by mass, and preferably in the range of from 50 to 80% by mass, relative to a total mass of the silver salt, the binder, and the like contained in the photosensitive layer.

Various additives which are used in the present embodiment are not particularly limited, and those which are known can be preferably used. For example, various matting agents can be used, and according to this, the surface roughness can be controlled. Incidentally, the matting agent is preferably a material which, after the development treatment, remains, does not impair the transparency, and can be dissolved in the treatment step.

[Constitution of Other Layers]

In the present invention, a non-illustrated protective layer may be provided on the photosensitive layer. In the present embodiment, the "protective layer" means a layer made from a binder such as gelatin and a high-molecular polymer and is formed on the photosensitive layer having photosensitivity for the purpose of revealing an effect for preventing a scratch or improving mechanical properties. A thickness thereof is preferably not more than 0.5 μm. Coating method and forming method of the protective layer are not particularly limited, and known coating methods and forming methods can be properly chosen. In addition, for example, an anti-halation layer can also be provided between the photosensitive layer and the transparent support.

Next, each of steps of a succeeding manufacturing method using a material shown in FIG. 6(b), in which the photosensitive layer containing a silver halide emulsion is formed, is described.

[Exposure]

As described above, exposure through a photomask for the purpose of forming an electrode pattern on a photosensitive material having the photosensitive layer 51 provided on a transparent support 32 is carried out. The exposure can be carried out using an electromagnetic wave. Examples of the electromagnetic wave include lights such as visible light rays, ultraviolet rays, etc., radiations such as X-rays, etc., and the like. Furthermore, light sources having wavelength distribution may be utilized for the exposure, and light sources having a specified wavelength may also be used.

[Development Treatment]

In the present embodiment, after exposing the photosensitive layer, a development treatment is further carried out. For the development treatment, usual development treatment techniques which are adopted for silver salt photographic films or printing papers, films for printing plate making, emulsion masks for photomask, and the like can be adopted. Though the developing solution is not particularly limited, PQ developing solutions, MQ developing solutions, MAA developing solutions, and the like can also be used. As commercially available products thereof, for example, developing solutions such as CN-16, CR-56, CP45X, FD-3, and PAPITOL, all of which are preparations of Fujifilm Corporation; C-41, E-6, RA-4, D-19, and D-72, all of which are preparations of KODAK; and the like, or developing solutions contained in kits thereof can be used. In addition, a lith developing solution can also be used.

In the present invention, the development treatment can include a fixing treatment which is carried out for the purpose of removing a silver salt in an unexposed portion for stabilization. In the present invention, in the fixing treatment, the techniques of fixing treatment which are used for silver salt photographic films or printing paper, films for printing plate making, emulsion masks for photomasks, or the like can be adopted.

A fixing temperature in the fixing step is preferably from about 20° C. to about 50° C., and more preferably from 25 to 45° C. In addition, a fixing time is preferably from 5 seconds to 1 minute, and more preferably from 7 seconds to 50 seconds. A replenishing amount of a fixing solution is preferably not more than 600 mL/m$^2$, more preferably not more than 500 mL/m$^2$, and especially preferably not more than 300 mL/m$^2$, relative to the treatment amount of the photosensitive material 122.

It is preferable that the developed and fixed photosensitive material 122 is subjected to a water washing treatment or a stabilization treatment. In the water washing treatment or stabilization treatment, the treatment is usually carried out in a water washing amount of not more than 20 liters per m$^2$ of the photosensitive material, and it can also be carried out in a replenishing amount of not more than 3 liters (inclusive of 0, namely washing with storage water).

With respect to the mass of metallic silver contained in the exposed area (conductive pattern) after the development treatment, the content thereof is preferably 50% by mass or more, and more preferably 80% by mass or more, relative to the mass of silver contained in the exposed area before the exposure. When the mass of silver contained in the exposed area is 50% by mass or more relative to the mass of silver contained in the exposed area before the exposure, high conductivity can be obtained, and hence, such is preferable.

In the present embodiment, though the gradation after the development treatment is not particularly limited, it preferably exceeds 4.0. When the gradation after the development treatment exceeds 4.0, the conductivity of the conductive metal part can be increased while keeping the translucency of the light-transmitting part high. Examples of a measure for allowing the gradation to exceed 4.0 include doping with a rhodium ion or an iridium ion as described above, incorporation of a polyethylene oxide derivative into the development treatment liquid, and the like.

(Film Hardening Treatment after Development Treatment)

After the photosensitive layer has been subjected to the development treatment, it is preferable to dip the resulting photosensitive material in a film hardener to achieve a film hardening treatment. Examples of the film hardener include those described in JP-A-2-141279 inclusive of potassium alum, dialdehydes such as glutaraldehyde, adipoaldehyde, 2,3-dihydroxy-1,4-dioxane, etc., boric acid, and the like.

The transparent electrode sheet is obtained after going through the foregoing steps. A surface resistance of the obtained transparent electrode sheet is preferably in the range of from 0.1 to 100 ohms/sq. (also expressed as "Ω/"), more preferably in the range of from 1 to 50 ohms/sq., and still more preferably in the range of from 1 to 10 ohms/sq.

In addition, a volume resistivity of the obtained transparent electrode sheet is preferably not more than 160 ohms·cm, more preferably in the range of from 1.6 to 16 ohms·cm, and still more preferably in the range of from 1.6 to 10 ohms·cm.

[Calendering Treatment]

In the manufacturing method according to the present embodiment, the developed transparent electrode sheet is subjected to a smoothing treatment. According to this, the conductivity of the transparent electrode sheet increases conspicuously. The smoothing treatment can be, for example, carried out by a calendering roll. In general, the calendering roll is constructed of a pair of rolls. The smoothing treatment using a calendering roll is hereunder expressed as a calendering treatment.

As the roll which is used for the calendering treatment, a plastic roll made of an epoxy resin, a polyimide, a polyamide, a polyimide-amide, or the like, or a metal roll is used. In particular, in the case where emulsion layers are provided on the both surfaces, it is preferable to carry out the treatment with metal rolls each other. In the case where an emulsion layer is provided on one surface, from the standpoint of preventing the generation of creases, a combination of a metal roll with a plastic roll can also be adopted. An upper limit value of a linear pressure is 1,960 N/cm (200 kgf/cm; 699.4 kgf/cm$^2$ as reduced into a surface pressure) or more, and more preferably 2,940 N/cm (300 kgf/cm; 935.8 kgf/cm$^2$ as reduced into a surface pressure) or more. An upper limit value of the linear pressure is not more than 6,880 N/cm (700 kgf/cm).

A temperature at which the smoothing treatment represented by calender rolling is applied is preferably from 10° C. (without temperature control) to 100° C. Though a more preferred temperature varies depending upon the density of scanning or shape of the metal mesh pattern or metal wiring pattern, or the kind of binder, it is in the range of from about 10° C. (without temperature control) to 50° C.

[Treatment for Bringing into Contact with Vapor]

Then, in the manufacturing method according to the present embodiment, the smoothed conductive pattern may be brought into contact with a vapor (vapor contact step). Examples of this vapor contact step include a method of bringing the smoothed transparent electrode sheet into contact with a superheated vapor; and a method of bringing the smoothed conductive pattern 108 into contact with a pressurized vapor (pressurized saturated vapor). According to this, the conductivity and transparency can be enhanced simply and easily within a short time. It may be considered that a part of the water-soluble binder is removed, whereby the binding site between the metals (conductive substances) increases.

[Water Washing Treatment]

In the manufacturing method according to the present embodiment, it is preferable that after bringing the transparent electrode sheet into contact with a superheated vapor or a pressurized vapor, the resultant is washed with water. By carrying out the water washing after the vapor contact treatment, the binder which has been dissolved or become brittle by the superheated vapor or pressurized vapor can be washed away, whereby the conductivity can be enhanced.

[Plating Treatment]

In the present embodiment, the above-described smoothing treatment may be carried out, and a plating treatment may be applied to the transparent electrode sheet. By the plating treatment, the surface resistance can be further lowered, whereby the conductivity can be increased. Though the smoothing treatment may be carried out at either the former stage or latter stage of the plating treatment, by carrying out the smoothing treatment at the former stage of the plating treatment, the plating treatment can be made efficient, whereby a uniform plated layer is formed. The plating treatment may be either one of an electrolytic treatment or an electroless treatment. In addition, a constituent material of the plated layer is preferably a metal having sufficient conductivity, and copper is preferable.

[Oxidation Treatment]

In the present embodiment, it is preferable that the transparent electrode sheet after the development treatment and the conductive metal part formed by the plating treatment are subjected to an oxidation treatment. For example, in the case where a slight amount of a metal is deposited in the light-transmitting part, by carrying out the oxidation treatment, the metal can be removed, thereby increasing the transmittance of the light-transmitting part to approximately 100%.

Incidentally, the present invention can be properly combined with technologies described in the patent publications and international patent pamphlets shown in the following Table 1. Expressions of "Japanese Laid-Open Patent", "Publication No.", "Pamphlet No.", and the like are omitted. Incidentally, the Japanese patent publication is expressed by putting "-" after the era name, for example, "2004-221564"; and the international patent pamphlet is expressed by putting "/" after the era name, for example, "2006/001461".

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |
| 2006/001461 | 2006/088059 | 2006/098333 | 2006/098336 | 2006/098338 |
| 2006/098335 | 2006/098334 | 2007/001008 | | |

EXAMPLES

The present invention is more specifically described below with reference to the following Examples. Incidentally, materials, use amounts, proportions, treatment contents, treatment procedures, and the like, which are shown in the following Examples, can be properly changed without departing from the gist of the present invention. In consequence, the scope of the present invention should not be restrictively interpreted by the following specific examples.

Examples 1 to 25 and Comparative Examples 1 to 7

(Preparation of Emulsion)

To the following Solution 1 kept at 38° C. and a pH of 4.5, the following Solutions 2 and 3 in an amount each corresponding to 90% were added at the same time over 20 minutes, thereby forming nuclear gains of 0.16 μm. Subsequently, the following Solutions 4 and 5 were added over 8 minutes, and the following Solutions 2 and 3 in an amount each corresponding to remaining 10% were further added for 2 minutes, thereby allowing the grains to grow to 0.21 μm. Furthermore, 0.15 g of potassium iodide was added, and the mixture was ripened for 5 minutes, thereby accomplishing the grain formation.

Solution 1:

| | |
|---|---|
| Water | 750 mL |
| Gelatin (phthalated gelatin) | 8 g |
| Sodium chloride | 3 g |
| 1,3-Dimethylimidazoline-2-thione | 20 mg |
| Sodium benzenethiosulfonate | 10 mg |
| Citric acid | 0.7 g |

Solution 2:

| | |
|---|---|
| Water | 300 mL |
| Silver nitrate | 150 g |

Solution 3:

| | |
|---|---|
| Water | 300 mL |
| Sodium chloride | 38 g |
| Potassium bromide | 32 g |
| Potassium hexachloroiridate(III) (0.005% KCl, 20% aqueous solution) | 5 mL |
| Ammonium hexachlororhodate (0.001% NaCl, 20% aqueous solution) | 7 mL |

Solution 4:

| | |
|---|---|
| Water | 100 mL |
| Silver nitrate | 50 g |

Solution 5:

| | |
|---|---|
| Water | 100 mL |
| Sodium chloride | 13 g |
| Potassium bromide | 11 g |
| Potassium ferrocyanide | 5 mg |

Thereafter, water washing was carried out by a flocculation method according to the usual way. Specifically, the temperature was lowered to 35° C., 3 liters of distilled water was added, and the pH was then lowered using sulfuric acid until the silver halide precipitated (the pH was in the range of 3.6±0.2). Subsequently, about 3 liters of the supernatant was removed (first water washing). Furthermore, 3 liters of distilled water was added, and sulfuric acid was then added until the silver halide precipitated. 3 liters of the supernatant was again removed (second water washing). The same operation as that in the second water washing was further repeated once (third water washing), thereby accomplishing the water washing and desalting processes. The emulsion after the water washing and desalting was adjusted to a pH of 6.4 and a pAg of 7.5. Thereafter, 10 mg of sodium benzenethiosulfonate, 3 mg of sodium benzenethiosulfinate, 15 mg of sodium thiosulfate, and 10 mg of chloroauric acid were added, and the mixture was subjected to chemical sensitization at 55° C. so as to obtain optimum sensitivity, to which were then added 100 mg of 1,3,3a,7-tetraazaindene as a stabilizing agent and 100 mg of PROXEL (a trade name, manufactured by ICI Co., Ltd.) as an antiseptic. The finally obtained emulsion was a silver iodochlorobromide cubic grain emulsion containing 0.08% by mole of silver iodide, having a ratio of silver chlorobromide of 70% by mole of silver chloride and 30% by mole of silver bromide, and having an average grain diameter of 0.22 μm and a coefficient of variation of 9%.

(Preparation of Photosensitive Layer Coating Solution)

To the foregoing emulsion, $1.2 \times 10^{-4}$ moles/mole-Ag of 1,3,3a,7-tetraazaindene, $1.2 \times 10^{-2}$ moles/mole-Ag of hydroquinone, $3.0 \times 10^{-4}$ moles/mole-Ag of citric acid, 0.90 g/mole-Ag of 2,4-dichloro-6-hydroxy-1,3,5-triazine sodium salt, and a trace amount of a film hardener were added, and the pH of the coating solution was adjusted with citric acid to 5.6, thereby preparing a photosensitive layer coating solution.

The above-prepared photosensitive layer coating solution was coated on a polyethylene terephthalate (PET) support having a thickness of 100 μm, which had been previously subjected to a hydrophilization treatment by, for example, providing an undercoat layer of gelatin.

The coating amount was adjusted such that the developed silver image had a thickness shown in Tables 2 and 3, respectively. In the present case, the thickness (unit: μm) of the developed silver image is calculated from only the volume of the developed silver and calculated on the assumption that the silver salt in the coated emulsion is entirely converted into developed silver in an exposed area, and a density of the developed silver is 10.5.

Incidentally, the photosensitive layer was constituted of three layers of a photosensitive layer lower layer (u-layer), a photosensitive layer central layer (m-layer), and a photosensitive layer upper layer (o-layer) from the side of PET that is a transparent support and fabricated by treating the three layers by a simultaneous coating system such that a coated silver amount ratio of u-layer/m-layer/o-layer was 1/2/1.

The volume ratio of silver to the binder was adjusted at the time of fabricating a photosensitive layer coating solution as shown in Tables 2 and 3, respectively. At that time, the amount of the binder was reduced into a volume on the assumption that its density was 1.34. In the present case, the binder is gelatin, and the addition amount thereof may be adjusted at any time of the preparation of an emulsion or the preparation of a photosensitive layer coating solution.

As the mercapto compound added to the photosensitive layer coating solution, a compound shown in the "Compound" column in each of Tables 2 and 3 was used, and its addition amount is expressed in terms of "mg" as an addition amount of the mercapto per gram of silver and described in Tables 2 and 3, respectively. Incidentally, in the present case, the mercapto compound was added at the time of preparing each of the coating solutions. A structure of the mercapto compound used is described after Table 3.

Furthermore, a protective layer having a film thickness of 0.15 μm and made of gelatin containing an antiseptic was provided on each of the foregoing coated samples.

(Exposure and Development Treatment)

Each of Coated Samples 1 to 32 shown in Tables 2 and 3 was brought into close contact with a photomask as described below and exposed using parallel light from a high pressure mercury vapor lamp as a light source. For the photomask, the pattern of the upper electrode sheet 11 shown in FIG. 8 was used. For the capacitive sensing section, 30 lattices shown in FIG. 9 were connected to each other to form a single electrode, a wire width of the unit square lattice forming the lattices was 3 μm, a side length of the lattice was 300 μm, and the number of electrodes was 30. After the exposure, the resulting sample was developed with the following developing solution and further subjected to a development treatment using a fixing solution (a trade name: N3X-R for CN16X, manufactured by Fujifilm Corporation). Thereafter, the resultant was rinsed with pure water and dried, and the obtained sample was then subjected to a calendering treatment to obtain Transparent Electrode Sheet 1. Transparent Electrode Sheets 2 to 32 were similarly obtained.

Incidentally, the treatment flow is as follows.

[Treatment Flow]

Processor: Automatic processor, manufactured by Fujifilm Corporation (FG-71 OPTS)

Treatment Condition:

The development was carried out at 35° C. for 30 seconds.
The fixation was carried out at 34° C. for 23 seconds.
The water washing was carried out using running water (5 L/min) for 20 seconds.

(Composition of Developing Solution)

The following compounds are contained in 1 liter (L) of the developing solution.

| | |
|---|---|
| Hydroquinone | 0.037 moles/L |
| N-Methylaminophenol | 0.016 moles/L |
| Sodium metaborate | 0.140 moles/L |
| Sodium hydroxide | 0.360 moles/L |
| Sodium bromide | 0.031 moles/L |
| Potassium metabisulfite | 0.187 moles/L |

(Evaluation)

By using the above-fabricated Transparent Electrode Sheets 1 to 32, the following evaluations were carried out.

(1) Measurement of Reflection Chromaticity:

The sample for measurement is placed on a BCRA black tile (glossy finish) and irradiated from the 0° direction, and a spectral reflectance of light received in the 45° direction is measured. The preferred tile is a BCRA black tile (glossy finish), manufactured by Sakata Inx Eng. Co., Ltd., and the reflection chromaticity of the black tile is 3.6 for L*, −0.9 for a*, and −0.6 for b*, respectively. As a reflection densitometer, Spectro Eye LT, manufactured by Gretag Macbeth can be used.

Incidentally, as the sample for measurement, a sample obtained by subjecting the above-obtained transparent electrode sheet to uniform exposure but not patternwise exposure, followed by a development treatment. As shown in FIG. 1, a value obtained by measuring the sample from the PET transparent support side was defined as $b_2*$, and a value obtained by measuring the sample from the electrode surface was defined as $b_1*$. From the reflection chromaticity $b_1*$ and the reflection chromaticity $b_2*$, an absolute value of a difference therebetween (also expressed as an "absolute value of Δb*") was calculated.

(2) Evaluation of Visibility:

Two sheets of each of the fabricated transparent electrode were used and fixed such that the directions of the two electrodes were made orthogonal to each other as shown in FIG. 11. This sample was observed from the perpendicular direction and the oblique direct of each azimuth, and the sensory evaluation regarding the color unevenness of reflected light, the fluctuation of reflected light, the contour of electrode, and the like was carried out as follows.

Evaluation A: Not noticeable at all

Evaluation B: Sometimes noticeable depending upon the direction

Evaluation C: Noticeable (3) Evaluation of Conductivity:

A resistance value of the electrode of the transparent electrode sheet was directly read and evaluated on the basis of a resistance value of the transparent electrode sheet of Comparative Example 5.

Evaluation A: A resistance value explicitly lower than the resistance value of Comparative Example 5 is exhibited. The resistance value is less than 20Ω/ (also expressed as "20 ohms/sq.") in terms of a surface resistance value.

Evaluation B: A resistance value is substantially equal to the resistance value of Comparative Example 5. The resistance value is 20 or more and not more than 50Ω/ in terms of a surface resistance value.

Evaluation C: A resistance value is inferior to the resistance value of Comparative Example 5 for some reason. The resistance value is a value exceeding 50Ω/ in terms of a surface resistance value. The foregoing results are summarized in the right-hand columns in the following Tables 2 and 3.

TABLE 2

| Coated Sample No. | Silver/binder volume ratio | Thickness of silver image (μm) | Compound No. | Addition amount of mercapto compound (Numerical value: mg/g-Ag) | | | Sample No. | Absolute value of | | | Visibility | Conductivity |
|---|---|---|---|---|---|---|---|---|---|---|---|---|
| | | | | o-Layer | m-Layer | u-Layer | | $b_1*$ | $b_2*$ | Δb* | | |
| 1 | 1 | 0.7 | A | 0 | 1 | 3 | Example 1 | −0.7 | 0.7 | 1.4 | A | B |
| 2 | 1 | 0.7 | B | 0 | 1 | 3 | Example 2 | −0.7 | 1.0 | 1.7 | A | B |
| 3 | 1 | 0.7 | B | 3 | 3 | 3 | Comparative Example 1 | −1.1 | 1.0 | 2.1 | C | B |
| 4 | 1 | 0.7 | C | 0 | 1 | 3 | Comparative Example 2 | −0.7 | 1.4 | 2.1 | C | B |
| 5 | 1 | 0.7 | D | 0 | 1 | 3 | Comparative Example 3 | −0.7 | 1.5 | 2.2 | C | B |

TABLE 2-continued

| Coated Sample No. | Silver/binder volume ratio | Thickness of silver image (μm) | Compound No. | Addition amount of mercapto compound (Numerical value: mg/g-Ag) o-Layer | m-Layer | u-Layer | Sample No. | $b_1^*$ | $b_2^*$ | Δb* | Visibility | Conductivity |
|---|---|---|---|---|---|---|---|---|---|---|---|---|
| 6 | 1 | 0.7 | E | 0 | 1 | 3 | Comparative Example 4 | −0.7 | 1.4 | 2.1 | C | B |
| 7 | 1 | 0.7 | F | 0 | 1 | 3 | Example 3 | −0.7 | 0.1 | 0.8 | A | B |
| 8 | 1 | 0.7 | G | 0 | 1 | 3 | Example 4 | −0.7 | 0.3 | 1.0 | A | B |
| 9 | 1 | 0.7 | F | 1.5 | 2.5 | 3 | Example 5 | −0.9 | 0.1 | 1.0 | A | B |
| 10 | 1 | 0.7 | F | 3 | 3 | 3 | Example 6 | −1.4 | 0.1 | 1.5 | A | B |
| 11 | 1 | 0.7 | — | 0 | 0 | 0 | Comparative Example 5 | −0.7 | 1.6 | 2.3 | C | B |
| 12 | 1.5 | 0.7 | — | 0 | 0 | 0 | Comparative Example 6 | 0 | 2.5 | 2.5 | C | A |
| 13 | 1.5 | 0.7 | F | 0 | 1 | 3 | Example 7 | 0 | 1.0 | 1.0 | A | A |
| 14 | 2 | 0.7 | — | 0 | 0 | 0 | Comparative Example 7 | 0.5 | 3.5 | 3.0 | C | A |
| 15 | 2 | 0.7 | F | 0 | 1 | 3 | Example 8 | 0.5 | 1.5 | 1.0 | A | A |
| 16 | 1 | 1.5 | F | 0 | 1 | 3 | Example 9 | −0.3 | 1.2 | 1.5 | A | A |
| 17 | 1.5 | 0.7 | F | 0 | 1 | 3*[1] | Example 10 | 0 | 0.8 | 0.8 | A | A |

*[1]The silver/binder volume ratio of the u-layer of Coated Sample No. 13 was changed to 0.5, and the silver/binder volume ratio of the whole of the photosensitive layer was kept at 1.5 by adjusting in the o-layer and the m-layer.

TABLE 3

| | | Preparation values | | | | | | | | | | Evaluation values of electrode sheet | | | | |
| | | Thickness of silver image (μm) | Content of silver bromide in each layer (% by mole) | | | Silver density in each layer (silver/binder volume ratio) | | | Addition amount of mercapto compound in each layer | | | | Reflection chromaticity b* | | | |
| Example | Sample No. | | o-Layer | m-Layer | u-Layer | o-Layer | m-Layer | u-Layer | Compound | o-Layer | m-Layer | u-Layer | $b_1^*$ | $b_2^*$ | Absolute value of difference | Visibility | Conductivity |
|---|---|---|---|---|---|---|---|---|---|---|---|---|---|---|---|---|---|
| Example 11 | 18 | 0.7 | 30 | 30 | 30 | 1.0 | 1.0 | 1.0 | F | — | — | 3 | −0.7 | 0.1 | 0.8 | A | B |
| Example 12 | 19 | 0.7 | 30 | 30 | 50 | 1.0 | 1.0 | 1.0 | F | — | — | 3 | −0.7 | 0 | 0.7 | A | B |
| Example 13 | 20 | 0.7 | 30 | 30 | 70 | 1.0 | 1.0 | 1.0 | F | — | — | 3 | −0.7 | −0.2 | 0.5 | A | B |
| Example 14 | 21 | 0.7 | 30 | 30 | 30 | 1.0 | 1.74 | 0.3 | F | — | — | 3 | −0.7 | −0.1 | 0.6 | A | B |
| Example 15 | 22 | 0.7 | 30 | 30 | 50 | 1.0 | 1.74 | 0.3 | F | — | — | 3 | −0.7 | −0.2 | 0.5 | A | B |
| Example 16 | 23 | 0.7 | 30 | 30 | 70 | 1.0 | 1.74 | 0.3 | F | — | — | 3 | −0.7 | −0.4 | 0.3 | A | B |
| Example 17 | 24 | 0.7 | 30 | 30 | 30 | 0.3 | 1.74 | 1.0 | F | — | — | 3 | −0.9 | 0.1 | 1.0 | A | B |
| Example 18 | 25 | 0.7 | 30 | 30 | 50 | 0.3 | 1.74 | 1.0 | F | — | — | 3 | −0.9 | 0 | 0.9 | A | B |
| Example 19 | 26 | 0.7 | 30 | 30 | 70 | 0.3 | 1.74 | 1.0 | F | — | — | 3 | −0.9 | −0.2 | 0.7 | A | B |
| Example 20 | 27 | 0.7 | 30 | 30 | 30 | 0.3 | 3.35 | 0.3 | F | — | — | 3 | −0.9 | −0.1 | 0.8 | A | B |
| Example 21 | 28 | 0.7 | 30 | 30 | 50 | 0.3 | 3.35 | 0.3 | F | — | — | 3 | −0.9 | −0.2 | 0.7 | A | B |
| Example 22 | 29 | 0.7 | 30 | 30 | 70 | 0.3 | 3.35 | 0.3 | F | — | — | 3 | −0.9 | −0.4 | 0.5 | A | B |
| Example 23 | 30 | 0.58 | 30 | 30 | 30 | 1.0 | 1.0 | 0.3 | F | — | — | 3 | −07 | −0.1 | 0.6 | A | B |
| Example 24 | 31 | 0.58 | 30 | 30 | 30 | 0.3 | 1.0 | 1.0 | F | — | — | 3 | −0.9 | 1.0 | 1.0 | A | B |
| Example 25 | 32 | 0.46 | 30 | 30 | 30 | 0.3 | 1.0 | 0.3 | F | — | — | 3 | −0.9 | −0.1 | 0.8 | A | B |

Incidentally, Examples 14 to 22 were adjusted such that the u-layer/m-layer/o-layer ratio was 1/2/1 in terms of a film thickness ratio but not 1/2/1 in terms of a coated silver amount ratio as in Examples 1 to 13, and a thickness of the silver image of a total sum of the three layers was 0.7 μm. Accordingly, since the silver/binder volume ratio of each of the u-layer and the o-layer was lowered to 0.3, the silver amount decreased and the binder amount increased from each of the u-layer and the o-layer were adjusted in the m-layer, thereby regulating an average silver/binder volume ratio in the whole of the photosensitive layer to 1.0.

In addition, the samples of Examples 23 to 25 in Table 3 were fabricated in the following manner. In the sample of Example 23, the silver/binder volume ratio was regulated to 0.3 by decreasing only the silver amount while keeping the binder thickness of the u-layer of Example 11. In the sample of Example 24, the silver/binder volume ratio was regulated to 0.3 by decreasing only the silver amount while keeping the binder thickness of the o-layer of Example 11. In the sample of Example 25, the silver/binder volume ratio was regulated to 0.3 by decreasing only the silver amount while keeping the binder thickness of each of the u-layer and the o-layer of Example 11. In consequence, the samples of Examples 23 to 25 are thinner in the thickness of the silver image than other samples shown in Table 3.

Structures of the compounds used in the Examples are shown below.

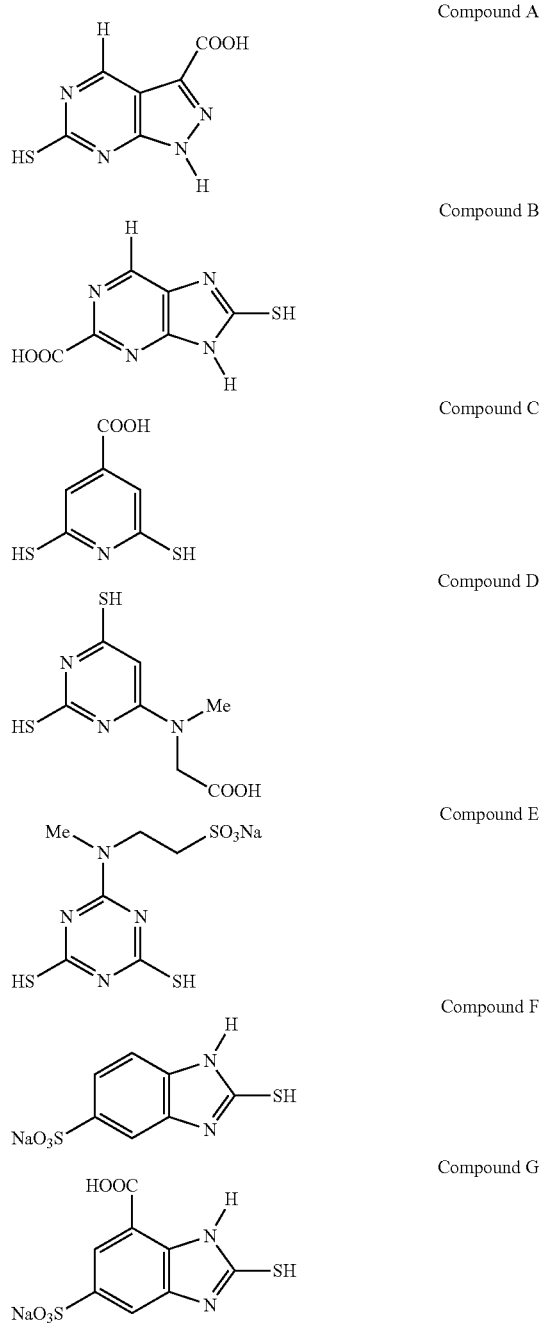

Compound A

Compound B

Compound C

Compound D

Compound E

Compound F

Compound G

The following were noted from the results shown in Tables 2 and 3.

The samples of Comparative Examples 5, 6 and 7 not using a mercapto compound are a sample, in which the coated silver amount is equal, and the silver/binder volume ratio is increased in the order of numerical values, and in these samples, the absolute value of Δb* becomes large correspondingly, namely the difference in color tint expands.

On the other hand, in all of the samples using a mercapto compound, the difference in color tint is small to one degree or another as compared with that in those of the Comparative Examples not using a mercapto compound.

In the samples using monocyclic Mercapto Compounds C, D and E, the effect for improving the color tint is a little as compared with the case of not using the mercapto compound.

Compounds A, B, F and G that are a fused ring compound exhibit a large improving effect, and in particular, it was noted that Compounds F and G having a sulfo group or a carboxyl group at from the 4-position to the 7-position of 2-mercaptobenzoimidazole are preferable.

Furthermore, though Example 10 is concerned with a sample in which the silver/binder volume ratio of the u-layer of Example 7 is changed from 1.5 to 0.5, and the silver/binder volume ratio of the whole of the photosensitive layer is kept at 1.5 by adjusting in the o-layer and the m-layer, $b_2^*$ is in the direction of improvement, and it was noted that it is also effective to change the silver/binder volume ratio of the u-layer to not more than 1.0.

Furthermore, the samples of Examples 11 to 22 shown in Table 3 are a sample in which assuming the use of the foregoing Mercapto Compound F in the u-layer, the effect for improving the color tint was investigated in the case of changing the content of silver bromide of the silver halide emulsion in the u-layer from 30% by mole to 50% by mole or 70% by mole, in the case of changing the silver/binder volume ratio in each of the u-layer and the o-layer from 1.0 to 0.3 while keeping the average silver/binder volume ratio in the whole of the photosensitive layer at 1.0, or in the case of a combination thereof.

By using the foregoing Mercapto Compound F in the u-layer, the color tint unevenness is improved to an extent that it is not viewed. However, by further regulating the silver density in the u-layer to about 0.3, the color tint unevenness is more hardly viewed, and by changing the content of silver bromide from 30% by mole to 50% by mole or 70% by mole as in Examples 15 and 16, the color tint unevenness is more hardly viewed. On the other hand, the direction of decreasing the silver density in the o-layer has an effect for shifting the color tint slightly bluish. This may be sometimes more desirable in relation to the colors in the surroundings and is effective for color tint adjustment.

Furthermore, different from the samples of Examples 11 to 22, the samples of Examples 23 to 25 shown in Table 3 are a sample in which the silver/binder volume ratio in each of the u-layer and the o-layer is lowered while keeping only the silver/binder volume ratio in the m-layer at 1.0. Examples 23 and 14, Examples 24 and 17, and Examples 25 and 20 are different from each other only in the silver/binder volume ratio in the m-layer are not different in the measured values of the reflection chromaticity. With respect to the conductivity, the resistance value in Examples 23 to 25 tends to be slightly higher.

Incidentally, though not shown in Table 3, in the case of regulating all of the silver/binder volume ratios in the o-layer, the m-layer, and the u-layer to 0.3, the conductivity was insufficient. Similarly, in the case of regulating the silver/binder volume ratios to 0.5, the conductivity was insufficient, too.

Examples 101 to 125 and Comparative Examples 101 to 107

The touch panel shown in FIG. 4 was fabricated using each of the transparent electrode sheets of Examples 1 to 25 and Comparative Examples 1 to 7.

A touch panel of Example 101 was fabricated in the following manner. The transparent electrode sheet of Example 1 was used for the upper transparent electrode sheet 11 and the lower electrode sheet 12 shown in FIG. 4, and the upper transparent electrode sheet 11 and the lower electrode sheet 12 were stuck to each other with an adhesive such that not only the upper electrode 21 and the lower electrode 22 faced and opposed, but the conduction directions of the two electrode sheets took an angle of 90° from each other and formed a uniform pattern shown in FIG. 11. A distance between the upper transparent electrode sheet 11 and the lower electrode sheet 12 was adjusted to 50 μm with a frame-like spacer.

Similar to the touch panel of Example 101, touch panels of Examples 102 to 122 and Comparative Examples 101 to 107 were fabricated. In the fabricated touch panels of Examples 101 to 122 and Comparative Examples 101 to 107, in view of the fact that the surface on which $b_1*$ is measured and the surface on which $b_2*$ is measured are alternately repeated, an observer sensorily observes a difference in color tint in terms of an absolute value of $\Delta b*$. Results of the visibility were the same as the evaluation results of visibility shown in Tables 2 and 3.

As compared with Comparative Examples 101 to 107, Examples 101 to 125 according to the present invention are reduced in the difference in color tint.

Comparative Examples 105, 106 and 107 not using a mercapto compound are concerned with a sample in which the coated silver amount is equal, and the silver/binder volume ratio is increased in the order of numerical values, and in these samples, the absolute value of $\Delta b*$ becomes large correspondingly, namely the difference in color tint expands.

On the other hand, in all of the samples using a mercapto compound, the difference in color tint is small to one degree or another as compared with that in those of the Comparative Examples not using a mercapto compound.

In the samples using monocyclic Mercapto Compounds C, D and E, the effect for improving the color tint is extremely a little as compared with the case of not using the mercapto compound.

Compounds A, B, F and G that are a fused ring compound exhibit a large improving effect, and in particular, it was noted that Compounds F and G having a sulfo group or a carboxyl group at any one of from the 4-position to the 7-position of 2-mercaptobenzoimidazole are preferable.

Furthermore, with respect to the touch panels of Examples 111 to 125 using the samples shown in Table 3, it could be confirmed that the touch panel using the foregoing Mercapto Compound F in the u-layer of Example 111 is improved to an extent that the color tint unevenness is not viewed. By the touch panel of Example 114 in which the silver density in the u-layer is further regulated to about 0.3, the color tint unevenness is more hardly viewed, and by changing the content of silver bromide from 30% by mole to 50% by mole or 70% by mole as in Examples 115 and 116, the color tint unevenness can be made to be still more hardly viewed. On the other hand, the direction of decreasing the silver density in the o-layer as in Example 117 has an effect for shifting the color tint slightly bluish. This may be sometimes more desirable in relation to the colors in the surroundings and is effective for color tint adjustment.

Examples 223, 225 and 226 and Comparative Example 225

Figure 3:
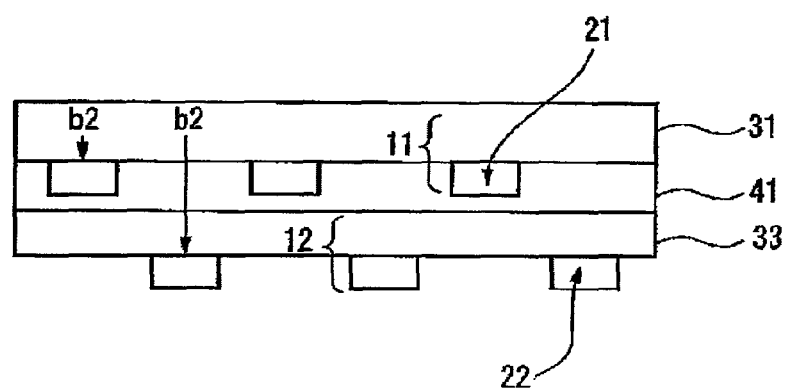
FIG. 3 is a schematic view of an embodiment of a stacking system of an upper electrode sheet and a lower electrode sheet.

The touch panel shown in FIG. 3 was fabricated using each of the transparent electrode sheets of Examples 3, 5 and 6 and Comparative Example 5.

A touch panel of Example 223 was fabricated in the following manner. The transparent electrode sheet of Example 3 was used for the upper transparent electrode sheet 11 and the lower electrode sheet 12 shown in FIG. 3, and the upper transparent electrode sheet 11 and the lower electrode sheet 12 were stuck to each other with an adhesive such that not only the upper electrode 21 and the lower electrode 22 were stacked so as to make each of the transparent supports thereof face at the side of an observer (touch panel user), but the conduction directions of the two electrode sheets 11 and 12 took an angle 90° from each other and formed a uniform pattern shown in FIG. 11.

Similar to the touch panel of Example 223, touch panels of Examples 225 and 226 and Comparative Example 225 were fabricated.

In the fabricated touch panels of Examples 223, 225 and 226 and Comparative Example 225, the surface on which $b_2*$ is measured (surface of the support side of the electrode) is observed, and hence, the observer sensorily recognizers a color close to the color tint of the measured value of $b_2*$. From Table 2, the measured value of $b_2*$ of the transparent electrode sheet of Comparative Example 5 is 1.6, whereas the measured value of $b_2*$ of the transparent electrode sheet of each of Examples 3, 5 and 6 is 0.1. Therefore, the touch panels of the Examples are a touch panel having a color of a uniform and substantially neutral b* axis and are preferable. On other hand, in the sample of the Comparative Example, the difference in color tint was slightly felt in the electrode part as compared with the portion where no electrode was formed.

Even in the case of using each of the transparent electrode sheets of the Examples other than the transparent electrode sheets of Examples 3, 5 and 6 for a touch panel, the effect for improving the color tint is perceived as compared with that in the Comparative Example.

Examples 301, 302, 307 to 310, 313, and 315 to 332

A photomask was brought into close contact with each of the Coated Samples 1, 2, 7 to 10, 13, and 15 to 32 having the preparation values shown in Tables 2 and 3, and each sample was exposed with parallel light using a high pressure mercury vapor lamp as a light source. The photomask is a uniform mesh in which the whole surface thereof is a square lattice, a wire width of the lattice is 3 μm, and a side length of the lattice is 300 μm. These exposed samples were subjected to the same development treatment as that in Example 1, thereby fabricating Transparent Electrode Sheets 301, 302, 307 to 310, 313, and 315 to 332. These samples had substantially the same color tint and surface resistance value as those in the electrode sheets of Examples 1, 2, 7 to 10, 13, and 15 to 32, and it was noted that these samples can be used as a transparent conductive film to be used for touch panels of a resistive film system or an electromagnetic wave shielding film.

Examples 401 to 412 and Comparative Examples 401 to 403

A silver iodochlorobromide cubic grain emulsion containing 0.08% by mole of silver iodide, having a ratio of silver chlorobromide of 70% by mole of silver chloride and 30% by mole of silver bromide, and having an average grain diameter of 0.22 μm and a coefficient of variation of 9% was prepared in the same manner as that in Example 1, and the same additives as those in Example 1 were added to this emulsion, thereby fabricating a photosensitive layer coating solution. On the basis of the composition of this photosensitive layer coating solution, the addition amount of gelatin was adjusted so as to have a volume ratio of silver to the binder shown in Table 4, and the kind and the addition amount of the mercapto compound were changed, thereby preparing coating solutions for three front surface layers (u-layer, m-layer, and o-layer) and three rear surface layers (u-layer, m-layer, and o-layer).

After subjecting the both surfaces of a 100 μm-thick polyethylene terephthalate (PET) film to a corona discharge treatment, a gelatin undercoat layer having a thickness of 0.1 μm and additionally on the undercoat layer an anti-halation layer having an optical density of about 1.0 and containing a dye capable of being decolored with an alkali of a developing solution were provided on the both surfaces of the resulting PET film, thereby preparing a support. The above-prepared photosensitive layer coating solutions were coated on the both surfaces of this support.

The coating amounts were set up in terms of a coated silver amount and adjusted such that a ratio of the coated silver amounts of the three photosensitive layers (u-layer, m-layer, and o-layer) was 1/2/1, and a total sum value of the silver amounts was a developed silver image thickness (unit: μm) shown in Table 4.

As already mentioned, the volume ratio of silver to the binder shown in Table 4 was reduced into a volume assuming that the density of the developed silver was 10.5, and the density of the binder was 1.34.

In addition, the addition amount of the mercapto compound which was added to the photosensitive layer coating solution is expressed in terms of "mg" as an addition amount of the mercapto per gram of silver. The structures of the mercapto compounds used are the same as the compounds used in Examples 1 to 25.

Furthermore, a protective layer having a film thickness of 0.15 μm and made of gelatin containing an antiseptic was provided on the o-layer. The four layers including the three photosensitive layers and the protective layer were coated using a simultaneous coating machine, thereby fabricating Photosensitive Materials 401 to 415.

(Exposure and Development Treatment)

Figure 14:
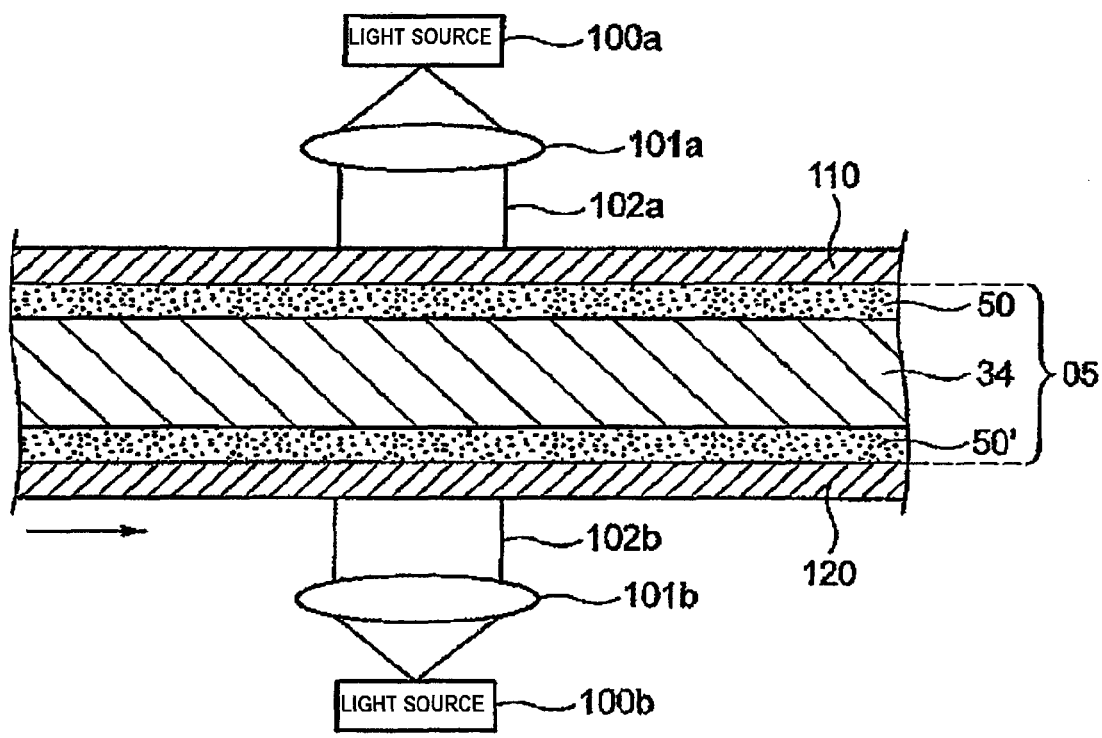
FIG. 14 is a schematic view for exposing the both surfaces of the photosensitive material shown FIG. 13 through a photomask.

Subsequently, each of the above-prepared Photosensitive Materials 401 to 415 was subjected to double-sided exposure using the double-sided exposure machine shown in FIG. 14. The exposure was carried out using a high pressure mercury vapor lamp as a light source, the mask for pattern formation shown in FIG. 9 as a photomask on the front surface side, and the mask for pattern formation shown in FIG. 10 as a photomask on the rear surface side. The windows for light transmission of the used masks are the same pattern as those shown in FIGS. 9 and 10, respectively, a wire width of the unit square lattice forming the lattices is 3 μm, and a side length of the lattice is 300 μm.

After the exposure, the same development and fixing treatments as those in Example 1 were carried out, thereby obtaining Transparent Conductive Sheets 401 to 415 of a double-sided electrode type.

(Fabrication of Touch Panel)

A polyethylene terephthalate film having a thickness of 300 μm was stuck with an adhesive onto the front surface side of the Transparent Conductive Sheet 401 of a double-sided electrode type as obtained by the foregoing development treatment. In addition, a glass sheet having a thickness of 3 mm was stuck with an adhesive onto the rear surface side of the Transparent Conductive Sheet 401, thereby fabricating a touch panel of Comparative Example 401. Touch panels of Comparative Examples 402 and 403 and touch panels of Examples 401 to 412 were fabricated in the same manner as that in Comparative Example 401, except for using the Transparent Conductive Sheets 402 to 415, respectively in place of the Transparent Conductive Sheet 401. Incidentally, Photosensitive Materials Nos. 401 to 403 are concerned with a sample in which both of the front and rear surfaces are a single layer not using a mercapto compound. In addition, Photosensitive Materials Nos. 404 to 415 are concerned with a sample in which the mercapto compound is added to only the photosensitive layer of the rear surface.

(Evaluation)

The above-fabricated Transparent Conductive Sheets 401 to 415 of a double-sided electrode type were evaluated in the same manners as those in Example 1. Results thereof are summarized in Table 4.

TABLE 4

| Example No. | Photosensitive Material No. | Distinction of surface | Silver/binder volume ratio | Thickness of silver image (μm) | Mercapto Compound No. | Addition amount of mercapto compound (Numerical value: mg/g-Ag) | | | $b_1^*$ | $b_2^*$ | Absolute value of Δb* | Visibility | Conductivity |
|---|---|---|---|---|---|---|---|---|---|---|---|---|---|
| | | | | | | o-Layer | m-Layer | u-Layer | | | | | |
| Comparative Example 401 | 401 | Front | 1 | 0.7 | — | — | — | — | −0.7 | | 2.3 | C | B |
| | | Rear | 1 | 0.7 | — | — | — | — | | 1.6 | | | |
| Comparative Example 402 | 402 | Front | 1.5 | 0.7 | — | — | — | — | 0 | | 2.5 | C | A |
| | | Rear | 1.5 | 0.7 | — | — | — | — | | 2.5 | | | |
| Comparative Example 403 | 403 | Front | 2 | 0.7 | — | — | — | — | 0.5 | | 3.0 | C | A |
| | | Rear | 2 | 0.7 | — | — | — | — | | 3.5 | | | |
| Example 401 | 404 | Front | 1 | 0.7 | — | — | — | — | −0.7 | | 0.8 | A | B |
| | | Rear | 1 | 0.7 | F | 0 | 0 | 3 | | 0.1 | | | |

TABLE 4-continued

| Example No. | Photo-sensitive Material No. | Distinction of surface | Silver/binder volume ratio | Thickness of silver image (μm) | Mercapto Compound No. | Addition amount of mercapto compound (Numerical value: mg/g-Ag) | | | | | Absolute value of Δb* | Visi-bility | Con-ductivity |
|---|---|---|---|---|---|---|---|---|---|---|---|---|---|
| | | | | | | o-Layer | m-Layer | u-Layer | $b_1$* | $b_2$* | | | |
| Example 402 | 405 | Front | 1.5 | 0.7 | — | — | — | — | 0 | | 1.0 | A | A |
| | | Rear | 1.5 | 0.7 | F | 0 | 0 | 3 | | 1.0 | | | |
| Example 403 | 406 | Front | 2 | 0.7 | — | — | — | — | 0.5 | | 0.5 | A | A |
| | | Rear | 2 | 0.7 | F | 0 | 0 | 3 | | 1.5 | | | |
| Example 404 | 407 | Front | 1 | 0.7 | — | — | — | — | −0.7 | | 1.4 | A | B |
| | | Rear | 1 | 0.7 | A | 0 | 0 | 3 | | 0.7 | | | |
| Example 405 | 408 | Front | 1 | 0.7 | — | — | — | — | −0.7 | | 1.0 | A | B |
| | | Rear | 1 | 0.7 | G | 0 | 0 | 3 | | 0.3 | | | |
| Example 406 | 409 | Front | 1 | 0.7 | — | — | — | — | −0.7 | | 1.7 | B | B |
| | | Rear | 1 | 0.7 | B | 0 | 0 | 3 | | 1.0 | | | |
| Example 407 | 410 | Front | 1 | 0.7 | — | — | — | — | −0.7 | | 1.8 | A | B |
| | | Rear | 1 | 0.7 | C | 0 | 0 | 5 | | 1.1 | | | |
| Example 408 | 411 | Front | 1 | 0.7 | — | — | — | — | −0.7 | | 1.9 | A | B |
| | | Rear | 1 | 0.7 | D | 0 | 0 | 5 | | 1.2 | | | |
| Example 409 | 412 | Front | 1 | 0.7 | — | — | — | — | −0.7 | | 1.8 | A | B |
| | | Rear | 1 | 0.7 | E | 0 | 0 | 5 | | 1.1 | | | |
| Example 410 | 413 | Front | 1 | 0.7 | — | — | — | — | −0.7 | | 1.9 | A | A |
| | | Rear | 1 | 1.5 | F | 0 | 0 | 3 | | 1.2 | | | |
| Example 411 | 414 | Front | 1 | 0.7 | — | — | — | — | −0.7 | | 1.2 | A | B |
| | | Rear | 1 | 0.7 | F | 0 | 1 | 1 | | 0.5 | | | |
| Example 412 | 415 | Front | 1 | 0.7 | — | — | — | — | −0.7 | | 1.5 | A | B |
| | | Rear | 1 | 0.7 | G | 0 | 1 | 1 | | 0.8 | | | |

The following are noted from the results shown in Table 4.

Though the transparent conductive sheet of a double-sided electrode type of Comparative Example 4, in which all of the photosensitive layers of the front surface and the rear surface do not use a mercapto compound, has a sufficient resistance value as an electrode constituting a capacitive touch panel, the unevenness of color tint is observed, and the visibility is poor. Furthermore, for the purpose of decreasing the resistance, when the silver/binder volume ratio is increased as in Comparative Examples 402 and 403, namely the silver density is increased, the color tint is more deteriorated.

On the other hand, in Examples 401 to 412 using a mercapto compound in the photosensitive layer of either one of the front surface or the rear surface, the color unevenness can be made small without increasing the resistance value, and the visibility is improved, as compared with the Comparative Examples.

With respect to the surface on which the mercapto compound is used, in the present experiment, though the mercapto compound is added to only the rear surface, the addition to the rear surface is preferable. So far as the rear surface is concerned, it is preferable to add the mercapto compound to the u-layer that is a photosensitive layer close to the support. As is noted from comparison between Examples 401 and 411, or comparison between Examples 405 and 412, it is noted that it is preferable to localize the mercapto compound in a lower layer (namely, a layer close to the support). Incidentally, since the silver amount of the m-layer is two times the silver amount of the u-layer, a total addition amount of the mercapto compound is the same amount between Examples 401 and 411.

In addition, the effect for improving the color tint also varies depending upon the kind of the mercapto compound, and in Examples 407 to 409 using monocyclic Mercapto Compounds C, D and E, respectively, the effect for improving the color tint is a little as compared with Comparative Example 401 not using a mercapto compound.

On the other hand, Examples 401 and 404 to 406 using Compounds A, B, F and G that are a fused compound, respectively, exhibit a large effect for improving the color tint unevenness, and in particular, it is noted that Examples 401 and 405 using Compounds F and G having a sulfo group or a carboxyl group at from the 4-position to the 7-position of 2-mercaptobenzoimidazole, respectively are preferable.

In addition, in Example 403 in which the silver density is regulated to 2 for the purpose of further decreasing the resistance, and Compound F is added to the u-layer of the photosensitive layer on the rear surface, the color tint unevenness is the smallest, and a low resistance is realized.

In addition, Example 410 is concerned with a sample in which not only Mercapto Compound F is added to the photosensitive layer of the rear surface, but the silver density is increased from 0.7 to 1.5. Example 410 exhibits that not only by making the lower electrode of the touch panel have a low resistance, the sensing capacity of capacitance can be enhanced, but at the time of viewing, the color tint unevenness of electrode can be improved.

Incidentally, in the foregoing, the mercapto compound is added only to the photosensitive layer of the rear surface. However, even when the mercapto compound is added to the photosensitive layer of the front surface, it is also possible to make the adjustment such that an observer feels that a balance in the difference in color tint between the front surface and the rear surface is neutral.

INDUSTRIAL APPLICABILITY

According to the present invention, by adjusting the reflection chromaticities of the front and rear surfaces of an electrode contained in a screen, a uniform screen with a small difference in color tint is obtained, and a degree of freedom for designing a capacitive touch panel is large. Furthermore, since the electrode sheet according to the present invention is of a low resistance, it is able to provide a touch panel which even when formed so as to have a large area, is excellent in terms of responsibility, is excellent in terms of, in addition to a color tint, visibility such that when seen as a screen, neither extraneous matter nor moire or the like is felt, and is able to achieve multi-touch. Furthermore, since the electrode can be formed by a stable step that is a development treatment, a touch panel which is excellent in terms of stability on processing and manufacturing and stable in terms of quality can be obtained. In addition, when the transparent electrode sheet according to the present invention is applied, a transparent conductive sheet to be used for resistive film type touch panels having an excellent color tone, an electromagnetic wave shielding sheet, a heater sheet, and an antistatic sheet can be obtained.

While the invention has been described in detail and with reference to specific embodiments thereof, it will be apparent to one skilled in the art that various changes and modifications can be made therein without departing from the spirit and scope thereof.

The present application is based on a Japanese patent application filed on Jan. 18, 2011 (Japanese Patent Application No. 2011-008327) and a Japanese patent application filed on Apr. 13, 2011 (Japanese Patent Application No. 2011-089400), the contents of which are incorporated herein by reference.

EXPLANATIONS OF NUMERALS OR LETTERS

05: Photosensitive material for manufacturing electrode sheet
10: Touch panel according to the present invention
11: Upper electrode sheet
12: Lower electrode sheet
14A, 14B: Plural conductive lattice sections for sensing capacitance
16A, 16B: Conductive connection section connecting lattice and lattice to each other
18A, 18B: Leader line for connecting electrode and external control section to each other
19: Dummy thin wire
21: Conductive thin wire constituting upper electrode
22: Conductive thin wire constituting lower electrode
30: Transparent material layer serving as touch surface
31: Transparent support also serving as touch surface
32: Transparent support for upper electrode sheet
33: Transparent support for lower electrode sheet
34: Transparent support for double-sized electrode
35: Transparent support
41: Adhesive layer also serving as insulating layer
42: Adhesive layer also serving as insulating layer
50, 50': Photosensitive material layer
51, 51': Photosensitive layer
53, 53': Photosensitive layer central layer (m-layer)
52, 52': Photosensitive layer upper layer (o-layer)
54, 54': Photosensitive layer lower layer (u-layer)
56, 56': Anti-halation layer
57, 57': Undercoat layer (easy-adhesive layer)
58, 58': Protective layer
61: Photosensitive material layer exposed by patternwise exposure
62: Portion exposed by patternwise exposure
63: Conductive thin wire of developed silver formed after development treatment
64: Film in unexposed area after development treatment
100a, 100b: Light sources a and b for exposure
101a, 101b: Lenses a and b for exposure
102a, 102b: Parallel lights a and b for exposure
110: Photomask to be used for forming upper electrode (front surface electrode)
120: Photomask to be used for forming lower electrode (rear surface electrode)
b1: Direction which an observer views and in which the electrode surface of the far side from the transparent support is viewed
b2: Direction which an observer views and in which the electrode surface of the near side to the transparent support is viewed

The invention claimed is:

1. A transparent electrode sheet comprising a transparent support having thereon a patterned electrode, wherein the electrode is made from a metal thin wire, a thickness of the metal thin wire is 0.1 μm or more, and an absolute value of a difference between a reflection chromaticity $b_1^*$ of a surface of the electrode at far side from the transparent support and a reflection chromaticity $b_2^*$ of a surface of the electrode at near side to the transparent support is not more than 2.

2. The transparent electrode sheet as claimed in claim 1, wherein the absolute value of a difference between the reflection chromaticity $b_1^*$ and the reflection chromaticity $b_2^*$ is not more than 1.5.

3. The transparent electrode sheet as claimed in claim 1, wherein the absolute value of a difference between the reflection chromaticity $b_1^*$ and the reflection chromaticity $b_2^*$ is not more than 1.0.

4. The transparent electrode sheet as claimed in claim 1, wherein the reflection chromaticity $b_1^*$ is 0 or less.

5. The transparent electrode sheet as claimed in claim 1, wherein the reflection chromaticity $b_1^*$ and the reflection chromaticity $b_2^*$ satisfy relations of $-2.0 < b_1^* \leq 0$ and $-1.0 < b_2^* \leq 1.0$.

6. The transparent electrode sheet as claimed in claim 1, wherein the reflection chromaticity $b_1^*$ and the reflection chromaticity $b_2^*$ satisfy relations of $-1.5 < b_1^* \leq -0.3$ and $-0.7 < b_2^* \leq 0.5$.

7. The transparent electrode sheet as claimed in claim 1, wherein the reflection chromaticity $b_1^*$ and the reflection chromaticity $b_2^*$ satisfy relations of $-1.0 < b_1^* \leq -0.5$ and $-0.5 < b_2^* \leq 0.2$.

8. The transparent electrode sheet as claimed in claim 1, wherein the thickness of the metal thin wire constituting the electrode is 0.1 μm or more and not more than 1.5 μm.

9. The transparent electrode sheet as claimed in claim 1, wherein the thickness of the metal thin wire constituting the electrode is 0.2 μm or more and not more than 0.8 μm.

10. The transparent electrode sheet as claimed in claim 1, wherein the metal thin wire is formed by a metal material selected from gold, silver and copper.

11. The transparent electrode sheet as claimed in claim 1, wherein the electrode is formed by a lattice made from the metal thin wire, and a length of one side of a unit lattice of the lattice is from 50 to 500 μm.

12. The transparent electrode sheet as claimed in claim 1, wherein the electrode is formed by a lattice made from the metal thin wire, and a length of one side of a unit lattice of the lattice is from 150 to 300 μm.

13. The transparent electrode sheet as claimed in claim 1, wherein the electrode patterned on the transparent support is a layer which is formed by exposing and developing at least one photosensitive layer containing a silver halide emulsion formed on the transparent support, and a volume ratio of silver to a binder contained in the photosensitive layer is 1.0 or more.

14. The transparent electrode sheet as claimed in claim 13, wherein the photosensitive layer containing a silver halide emulsion contains at least one mercapto compound, and a content of the mercapto compound in the photosensitive layer is higher at a side near to the transparent support than an average content of the mercapto compound in the photosensitive layer.

15. The transparent electrode sheet as claimed in claim 14, wherein the mercapto compound comprises, as a skeleton, a 5-membered ring azole having a nitrogen-hydrogen bond or a 6-membered ring azine having a nitrogen-hydrogen bond, and the hydrogen is dissociable.

16. The transparent electrode sheet as claimed in claim 14, wherein the mercapto compound has, as a substituent, an $SO^3M$ group at one of the 4-position to the 7-position of 2-mercaptobenzoimidazole and further has, as a substituent, at least one selected from a hydrogen atom, a hydroxyl group, a lower alkyl group, a lower alkoxy group, a carboxyl group, a halogen group and a sulfo group, and M is an alkali metal atom or an ammonium group.

17. The transparent electrode sheet as claimed in claim 13, wherein a volume ratio of silver to a binder contained in the photosensitive layer at a side near to the transparent support is less than 1.0.

18. A capacitive touch panel obtained by using two sheets of the transparent electrode sheet as claimed in claim 1 and stacking the two sheets via an insulator such that the electrode sides thereof face and oppose each other, wherein directions of conduction of the electrodes of the two electrode sheets are substantially orthogonal to each other.

19. A transparent electrode sheet comprising a transparent support having on both surfaces thereof a patterned electrode, wherein each of the electrodes is made from a metal thin wire, a thickness of each said metal thin wire is 0.1 μm or more, and an absolute value of a difference between a reflection chromaticity $b_1^*$ of a surface, at far side from the transparent support, of the electrode formed on one surface of the transparent support and a reflection chromaticity $b_2^*$ of a surface, at near side to the transparent support, of the electrode formed on other surface of the transparent support is not more than 2.

20. The transparent electrode sheet as claimed in claim 19, wherein the absolute value of a difference between the reflection chromaticity $b_1^*$ and the reflection chromaticity $b_2^*$ is not more than 1.5.

21. The transparent electrode sheet as claimed in claim 19, wherein the absolute value of a difference between the reflection chromaticity $b_1^*$ and the reflection chromaticity $b_2^*$ is not more than 1.0.

22. The transparent electrode sheet as claimed in claim 19, wherein the reflection chromaticity $b_1^*$ and the reflection chromaticity $b_2^*$ satisfy relations of $-2.0<b_1^*\leq0$ and $-1.0<b_2^*\leq1.0$.

23. The transparent electrode sheet as claimed in claim 19, wherein the thickness of each said metal thin wire constituting each of the electrodes is 0.1 μm or more and not more than 1.5 μm.

24. The transparent electrode sheet as claimed in claim 19, wherein each said metal thin wire is formed by a metal material selected from gold, silver and copper.

25. The transparent electrode sheet as claimed in claim 19, wherein each of the electrodes is formed by a lattice made from the metal thin wire, and a length of one side of a unit lattice of the lattice is from 50 to 500 μm.

26. The transparent electrode sheet as claimed in claim 19, wherein each electrode patterned on the transparent support is a layer which is formed by exposing and developing at least one photosensitive layer containing a silver halide emulsion formed on the transparent support, and a volume ratio of silver to a binder contained in the photosensitive layer is 1.0 or more.

27. The transparent electrode sheet as claimed in claim 26, wherein the photosensitive layer containing a silver halide emulsion contains at least one mercapto compound, and a content of the mercapto compound in the photosensitive layer is higher at a side near to the transparent support than an average content of the mercapto compound in the photosensitive layer.

28. The transparent electrode sheet as claimed in claim 27, wherein the mercapto compound comprises, as a skeleton, a 5-membered ring azole having a nitrogen-hydrogen bond or a 6-membered ring azine having a nitrogen-hydrogen bond, and the hydrogen is dissociable.

29. The transparent electrode sheet as claimed in claim 27, wherein the mercapto compound has, as a substituent, an $SO^3M$ group at one of the 4-position to the 7-position of 2-mercaptobenzoimidazole and further has, as a substituent, at least one selected from a hydrogen atom, a hydroxyl group, a lower alkyl group, a lower alkoxy group, a carboxyl group, a halogen group and a sulfo group, and M is an alkali metal atom or an ammonium group.

30. The transparent electrode sheet as claimed in claim 26, wherein a volume ratio of silver to a binder contained in the photosensitive layer at a side near to the transparent support is less than 1.0.

31. A touch panel, which comprises the transparent electrode sheet as claimed in claim 19.

* * * * *